(12) United States Patent
Wang

(10) Patent No.: US 10,748,813 B2
(45) Date of Patent: Aug. 18, 2020

(54) FIN-LIKE FIELD EFFECT TRANSISTOR DEVICE

(71) Applicant: TAIWAN SEMICONDUCTOR MANUFACTURING CO., LTD., Hsinchu (TW)

(72) Inventor: Shih-Wei Wang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/100,327

(22) Filed: Aug. 10, 2018

(65) Prior Publication Data

US 2018/0350676 A1 Dec. 6, 2018

Related U.S. Application Data

(62) Division of application No. 15/585,389, filed on May 3, 2017, now Pat. No. 10,049,930.

(60) Provisional application No. 62/426,641, filed on Nov. 28, 2016.

(51) Int. Cl.

| *H01L 29/78* | (2006.01) |
|---|---|
| *H01L 21/768* | (2006.01) |
| *H01L 29/66* | (2006.01) |
| *H01L 29/423* | (2006.01) |
| *H01L 29/417* | (2006.01) |

(52) U.S. Cl.
CPC .. *H01L 21/76897* (2013.01); *H01L 21/76801* (2013.01); *H01L 29/41791* (2013.01); *H01L 29/42376* (2013.01); *H01L 29/6656* (2013.01); *H01L 29/66545* (2013.01); *H01L 29/66795* (2013.01); *H01L 29/785* (2013.01)

(58) Field of Classification Search
CPC ......... H01L 21/76897; H01L 21/76808; H01L 21/76816; H01L 29/42376; H01L 29/66545; H01L 29/6656; H01L 29/66795; H01L 29/785; H01L 2029/7858; H01L 2221/1031; H01L 21/02063; H01L 2027/11866; H01L 21/823475; H01L 29/78615; H01L 29/41725–41791; H01L 29/7839; H01L 29/806; H01L 21/823871
See application file for complete search history.

(56) References Cited

U.S. PATENT DOCUMENTS

| 7,667,271 | B2 | 2/2010 | Yu et al. |
|---|---|---|---|
| 7,910,453 | B2 | 3/2011 | Xu et al. |
| 8,377,779 | B1 | 2/2013 | Wang |
| 8,399,931 | B2 | 3/2013 | Liaw et al. |
| 8,652,894 | B2 | 2/2014 | Lin et al. |

(Continued)

*Primary Examiner* — Shahed Ahmed
(74) *Attorney, Agent, or Firm* — McClure, Qualey & Rodack, LLP

(57) ABSTRACT

A semiconductor device and a method for fabricating the semiconductor device are provided. In the method for fabricating the semiconductor device, at first, a FinFET (Field-Effect Transistor) device is provided. Then, spacers and various mask layers are formed on gate structures of the FinFET device to provide a self-alignment structure. Thereafter, source/drain contacts and gate contacts are formed in the self-alignment structure to enable the source/drain contacts to be electrically connected to the source/drain structures of the FinFET device, and enable the gate contacts to be electrically connected to the gate structures. Therefore, self-alignment is achieved.

20 Claims, 27 Drawing Sheets

(56) References Cited

U.S. PATENT DOCUMENTS

| | | |
|---|---|---|
| 8,686,516 B2 | 4/2014 | Chen et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,508,825 B1 * | 11/2016 | Basker .................. H01L 29/665 |
| 2014/0001574 A1 | 1/2014 | Chen et al. |
| 2014/0110755 A1 | 4/2014 | Colinge |
| 2014/0151812 A1 | 6/2014 | Liaw |
| 2015/0287636 A1 * | 10/2015 | Wei ................. H01L 21/823878 257/368 |
| 2015/0364378 A1 * | 12/2015 | Xie ................. H01L 21/823437 257/368 |
| 2015/0380305 A1 * | 12/2015 | Basker ............. H01L 21/76846 257/77 |
| 2016/0379925 A1 * | 12/2016 | Ok .................... H01L 21/76895 257/288 |

* cited by examiner

FIN-LIKE FIELD EFFECT TRANSISTOR DEVICE

RELATED APPLICATION

This application is a Divisional Application of U.S. application Ser. No. 15/585,389 filed May 3, 2017, which is issued on Aug. 14, 2018, as U.S. Pat. No. 10,049,930, which claims the benefit of the Provisional Application Ser. No. 62/426,641, filed Nov. 28, 2016, the entire disclosures of which are incorporated herein by reference.

BACKGROUND

The semiconductor integrated circuit (IC) industry has experienced rapid growth. In the course of the IC evolution, functional density (defined as the number of interconnected devices per chip area) has generally increased while geometry size (i.e., the smallest component (or line) that can be created using a fabrication process) has decreased. A scaling down process generally provides benefits by increasing production efficiency and lowering associated costs. But, such scaling down has increased the complexity of processing and manufacturing ICs. For these advances to be realized, similar developments in IC manufacturing are needed.

For example, as the semiconductor IC industry has progressed into nanometer technology process nodes in pursuit of higher device density, higher performance, and lower costs, challenges from both fabrication and design have resulted in the development of three-dimensional (3D) devices such fin-like field effect transistors (FinFETs). Advantages of FinFET devices include reducing the short channel effect and higher current flow. However, conventional FinFET devices and methods of fabricating FinFET devices have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
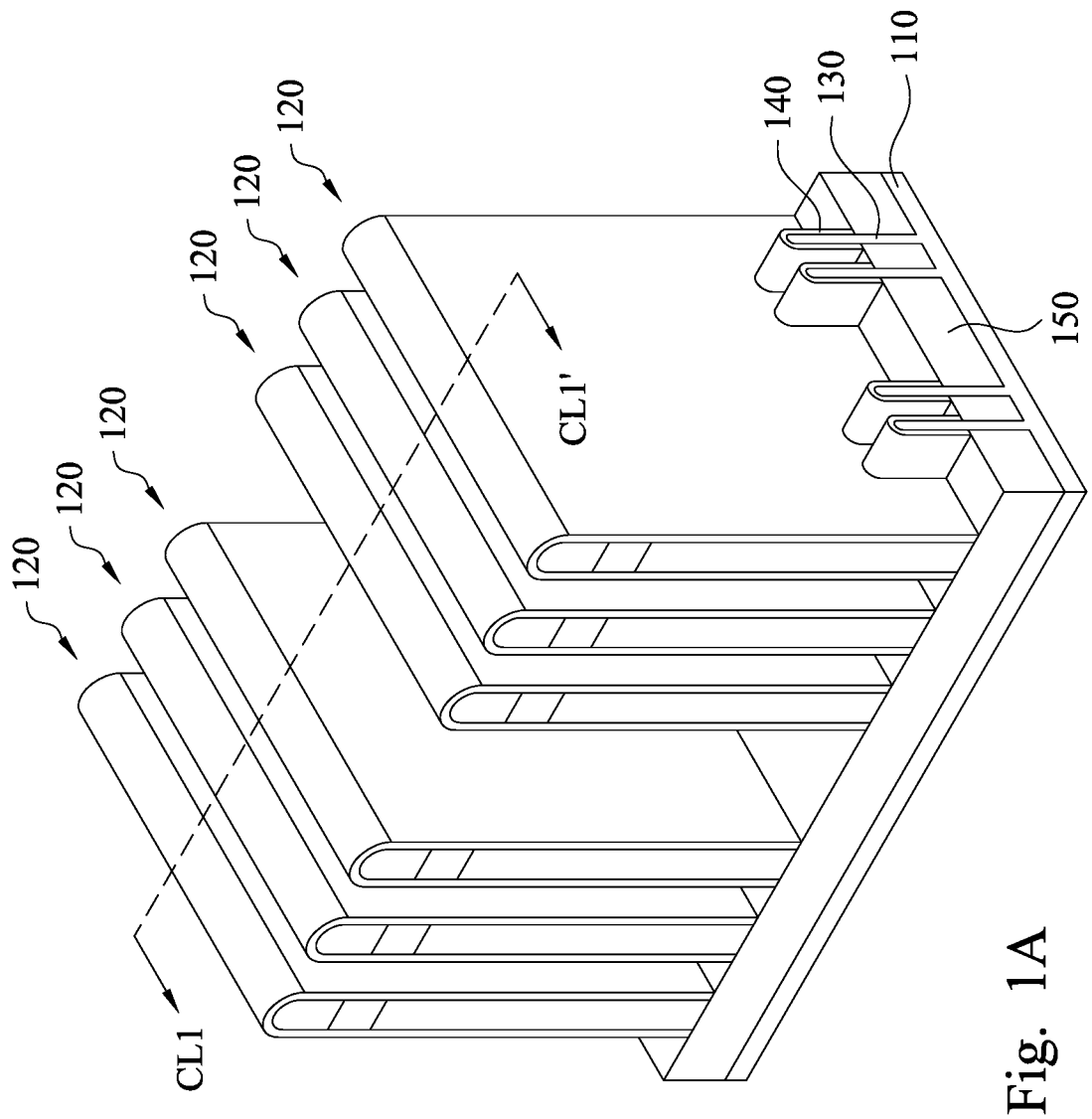
FIG. 1A to FIG. 1Y are schematic cross-sectional views of intermediate stages showing a method for fabricating a transistor device having a self-alignment structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

Embodiments of the present disclosure are directed to a method for fabricating a transistor device having a self-alignment structure. In the method, at first, a FinFET (Field-Effect Transistor) device is provided. The FinFET device includes plural gate structures, plural source/drain structures, and plural fin structures. Then, the self-alignment structure are formed on the FinFET device to enable plural gate contacts to be electrically connected to the gate structures, and enable plural source/drain contacts to be electrically connected to the source/drain structures. Therefore, a purpose of self-alignment is achieved.

Figure 1B:
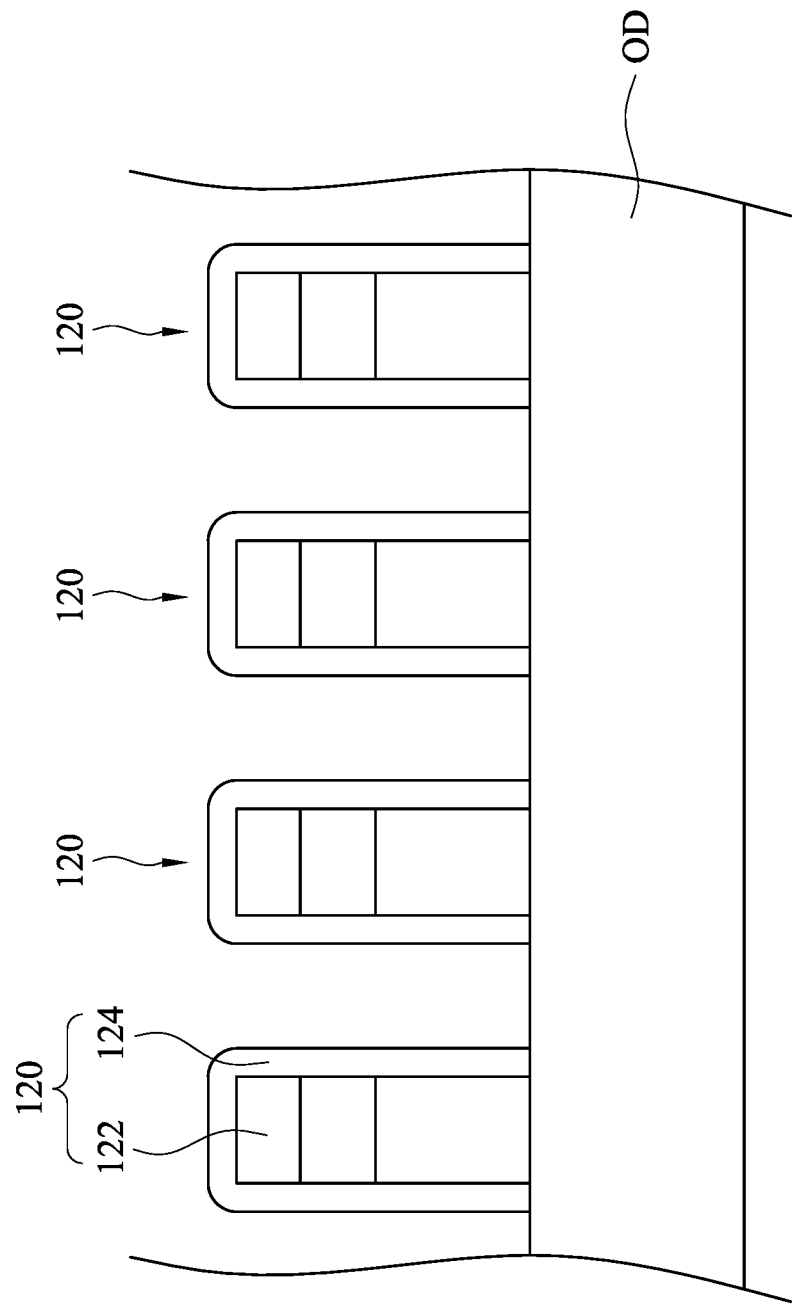
Figure 1C:
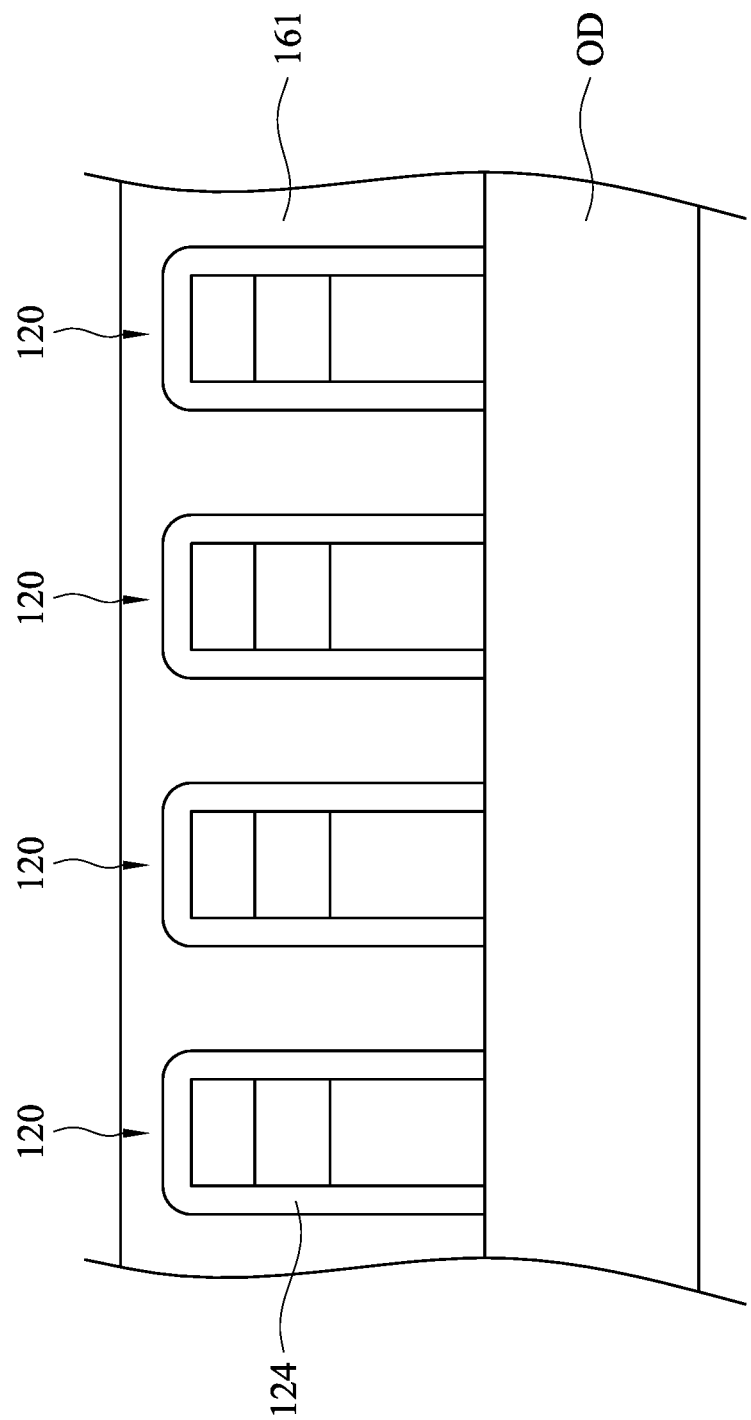
Figure 1D:
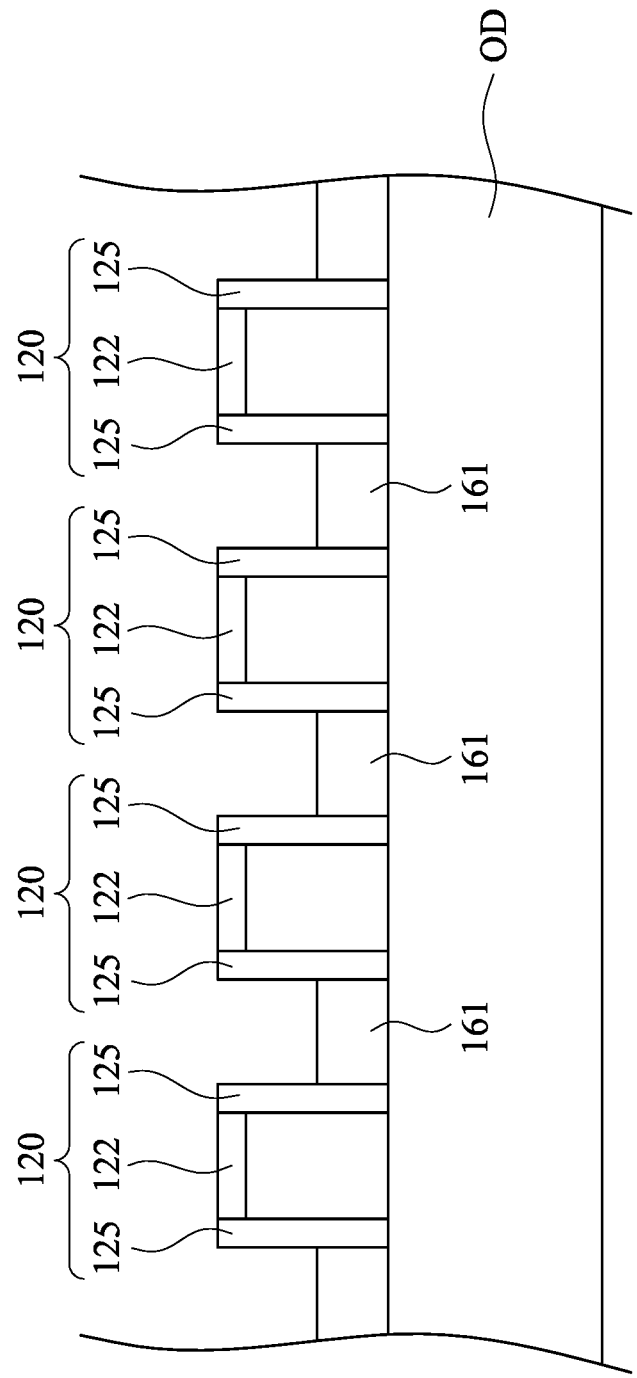
Figure 1E:
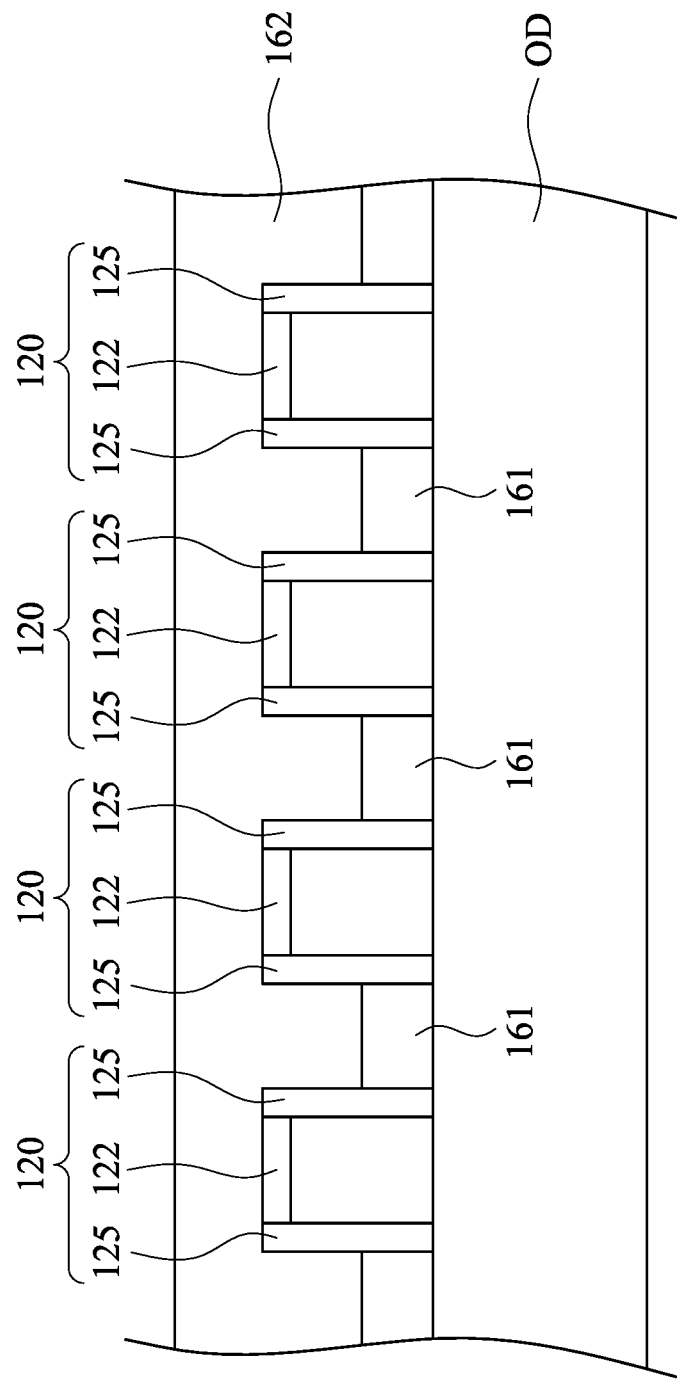
Figure 1F:
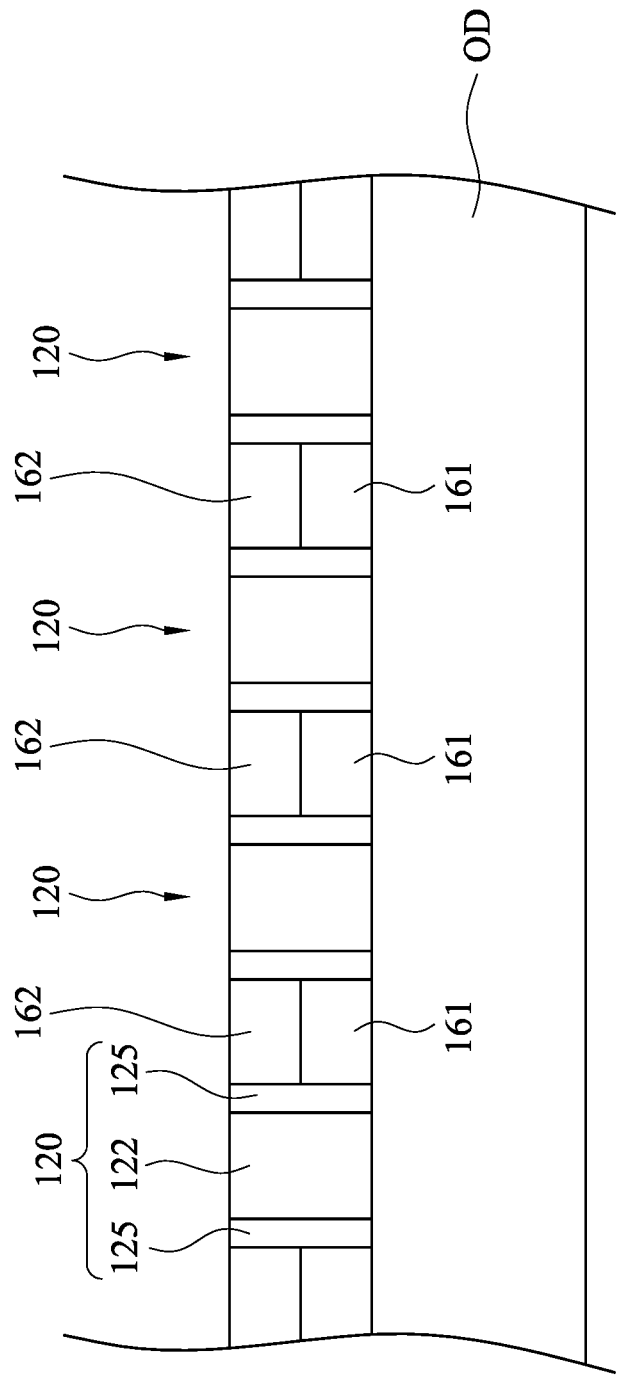
Figure 1G:
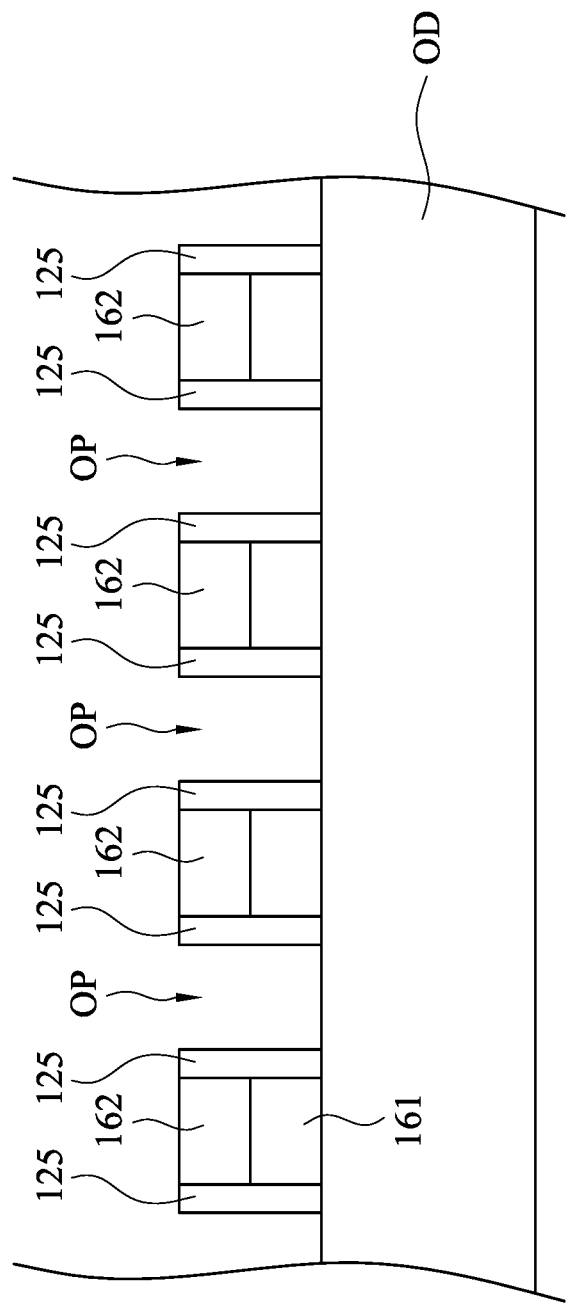
Figure 1H:
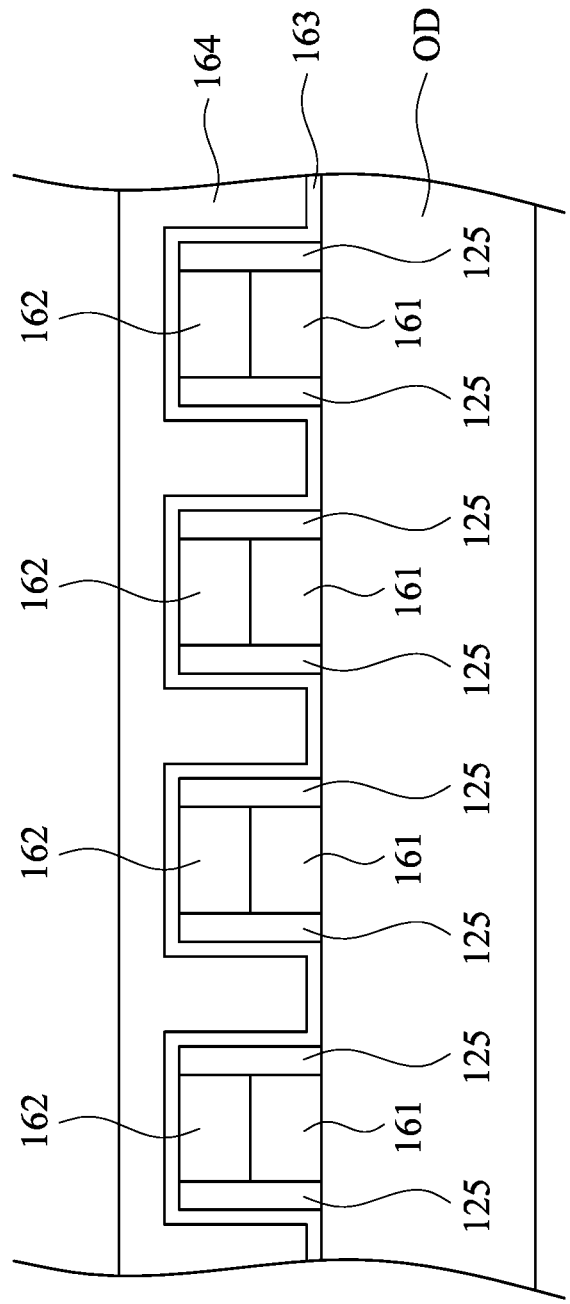
Figure 1I:
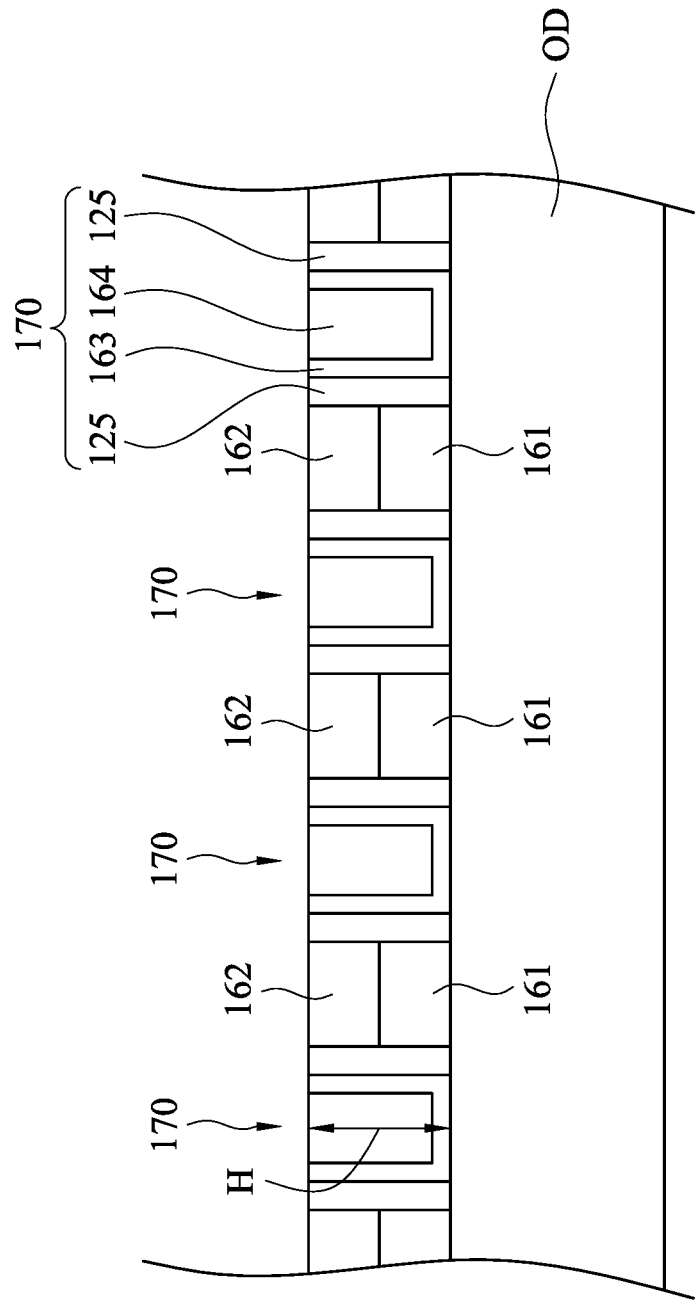
Figure 1J:
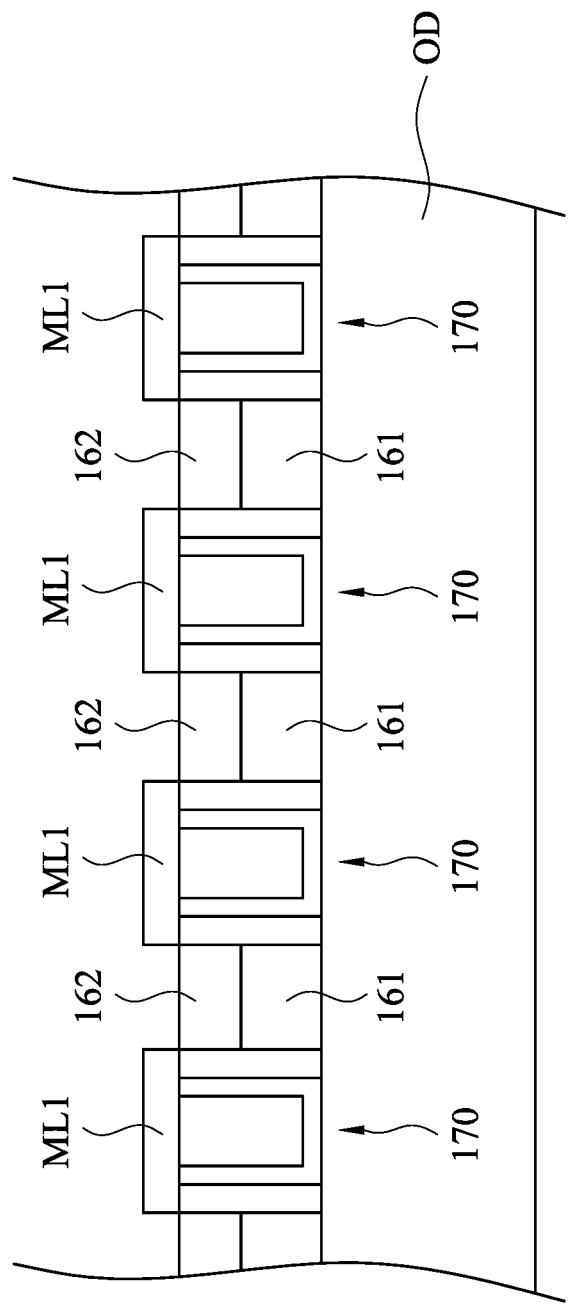
Figure 1K:
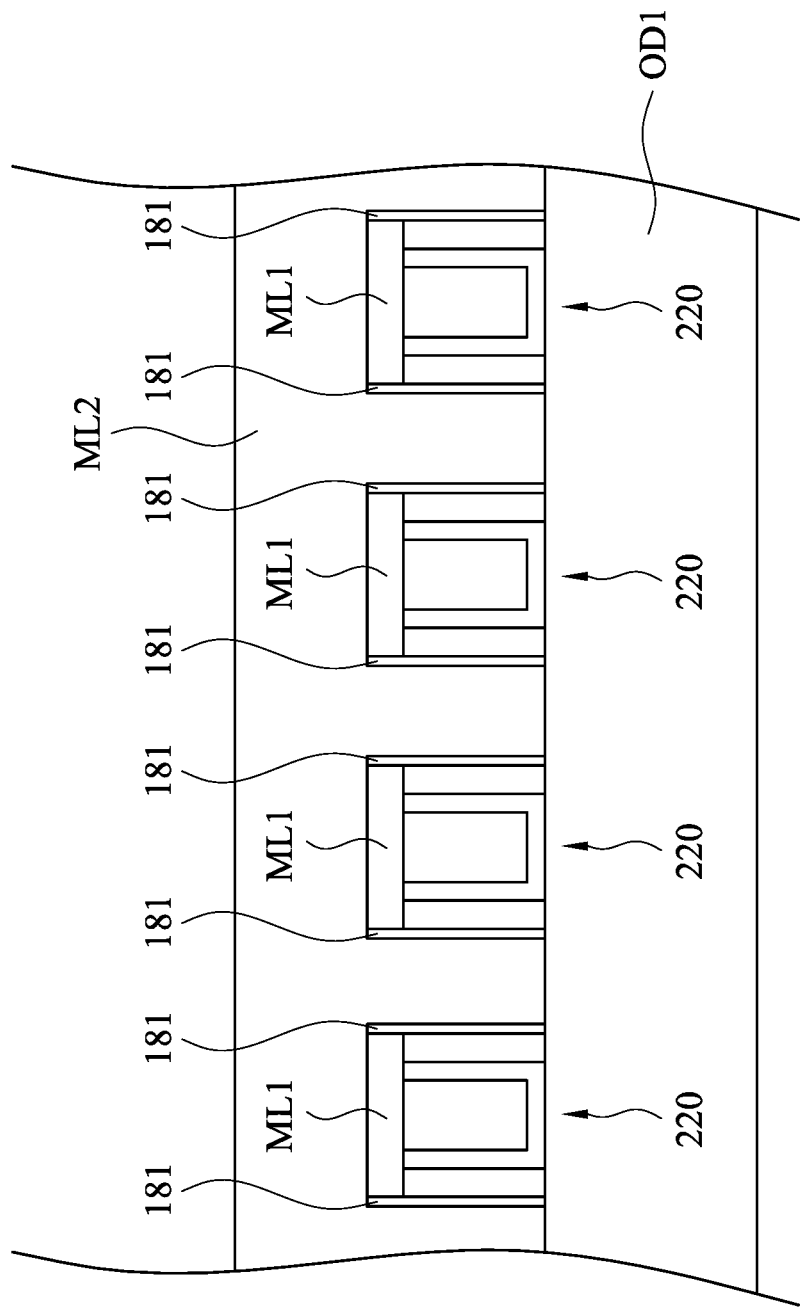
Figure 1L:
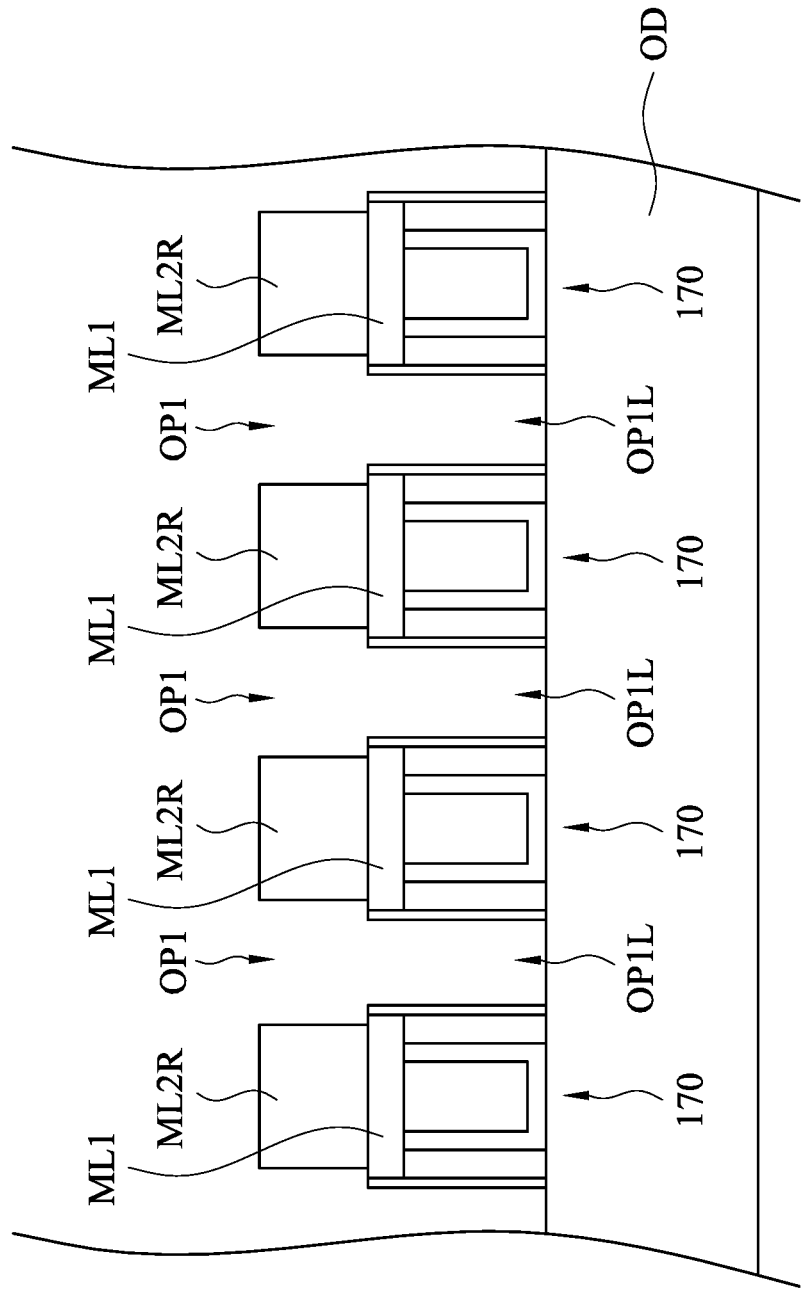
Figure 1M:
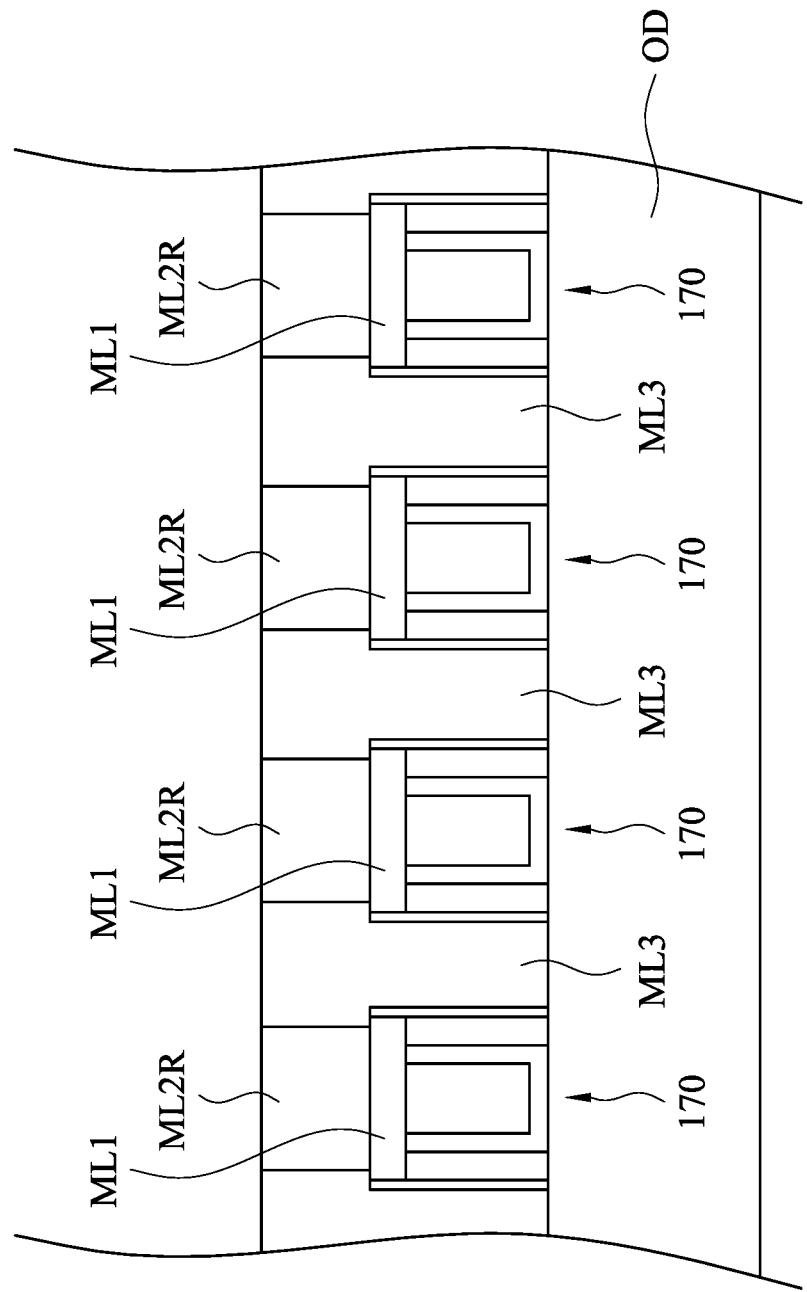
Figure 1N:
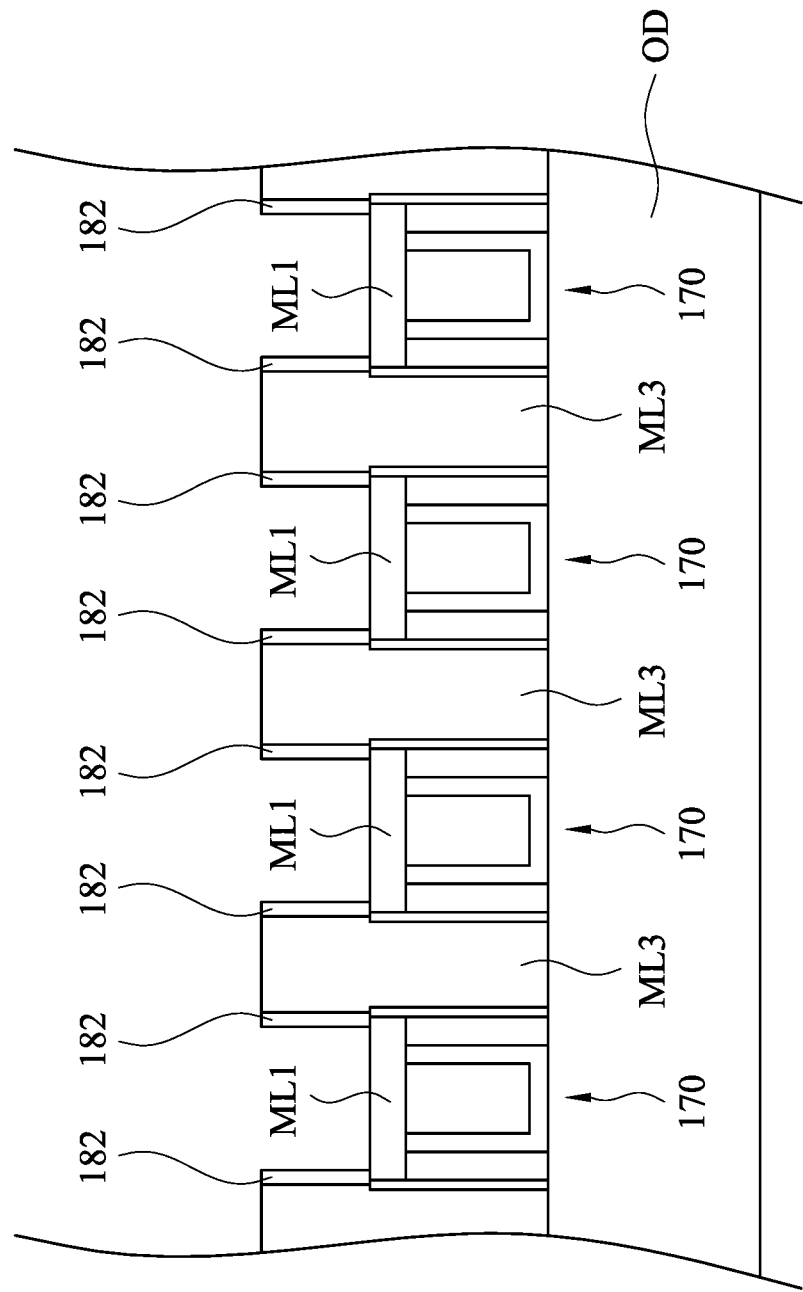
Figure 1O:
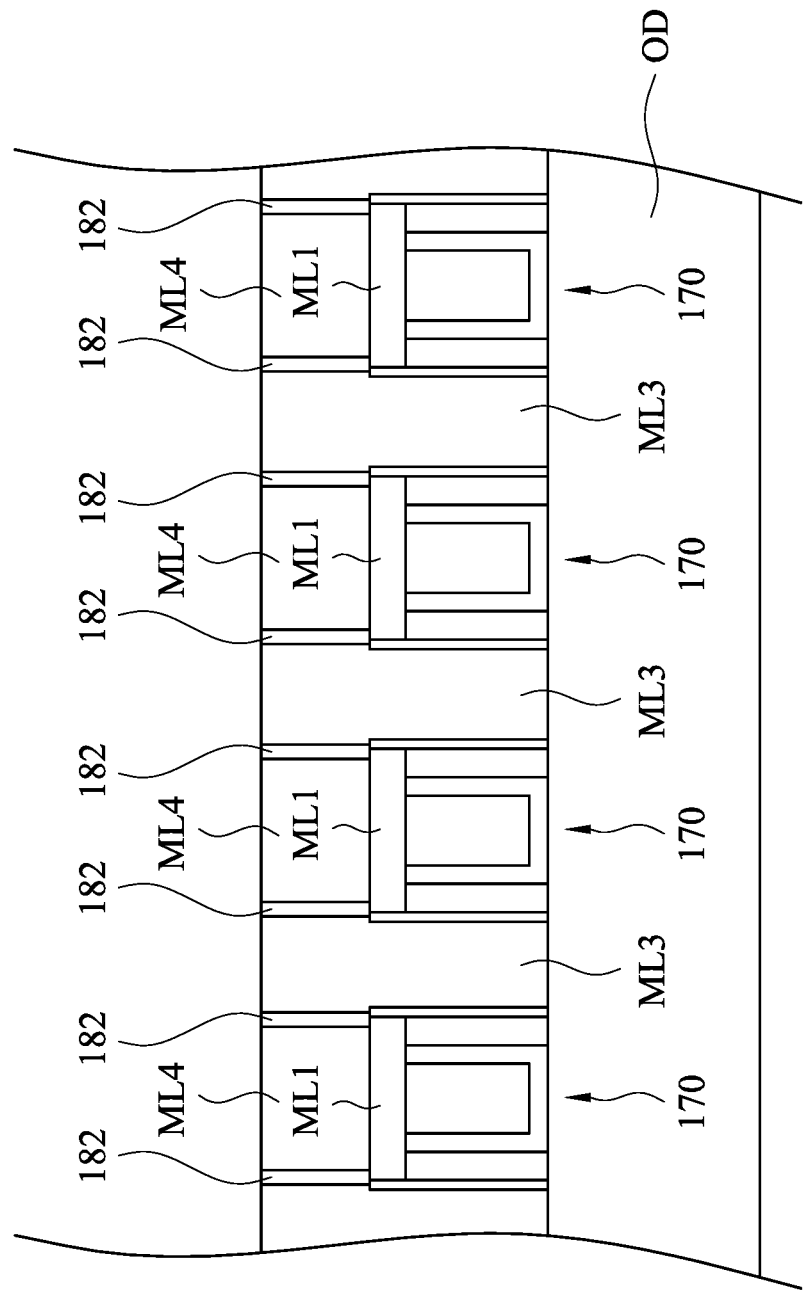
Figure 1P:
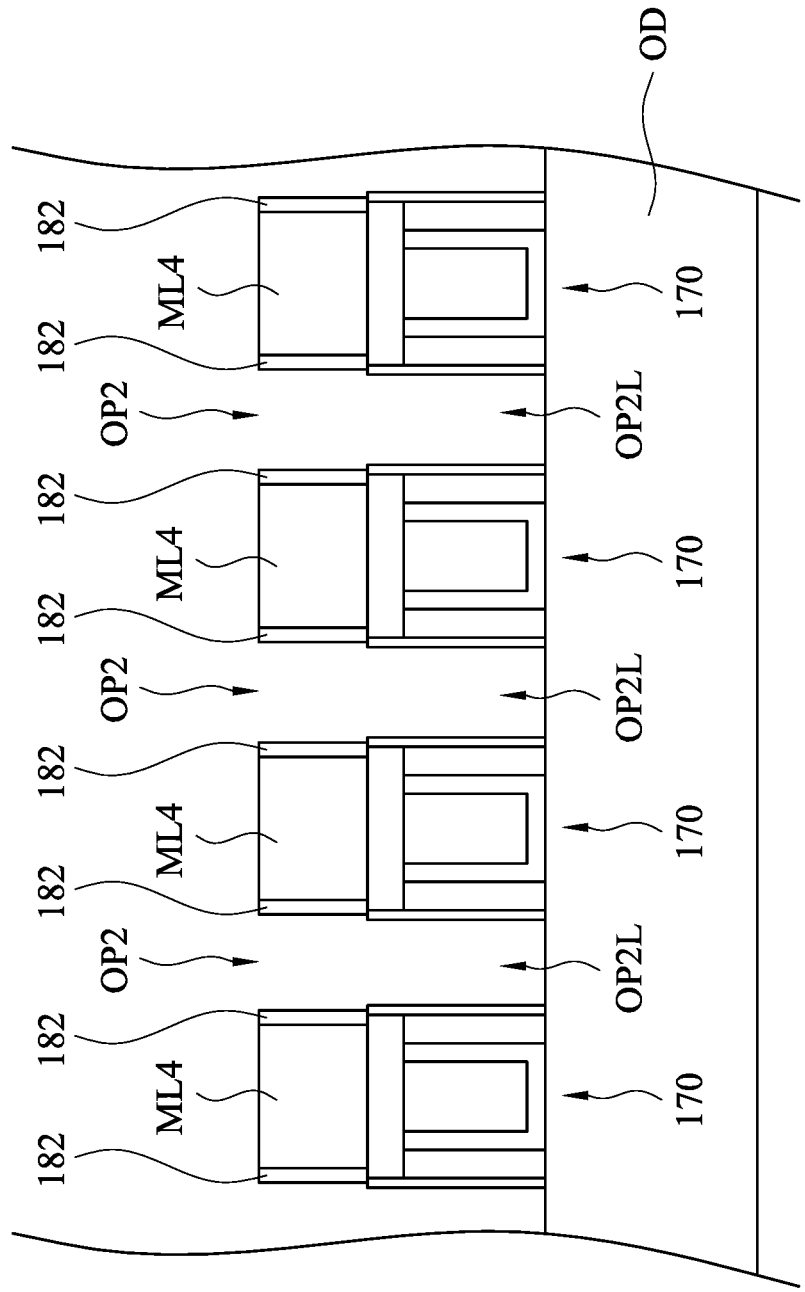
Figure 1Q:
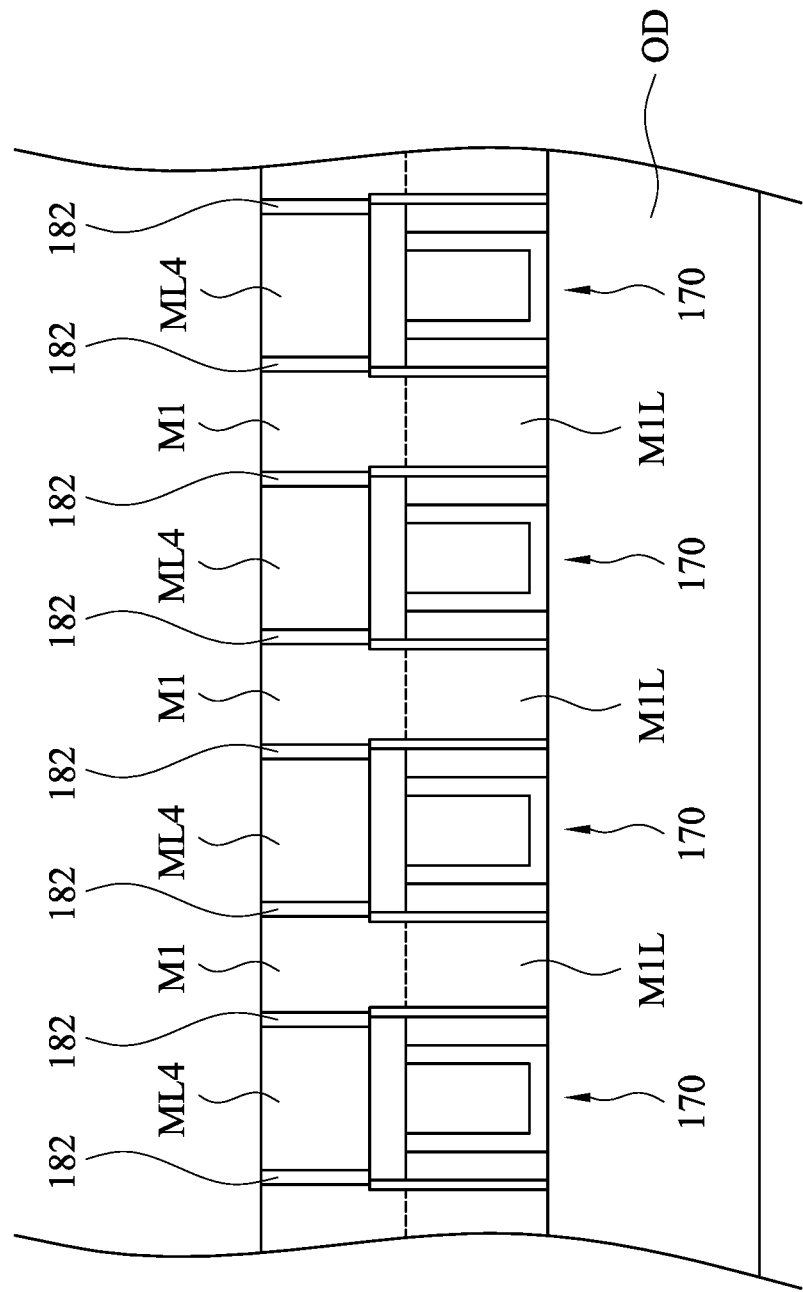
Figure 1R:
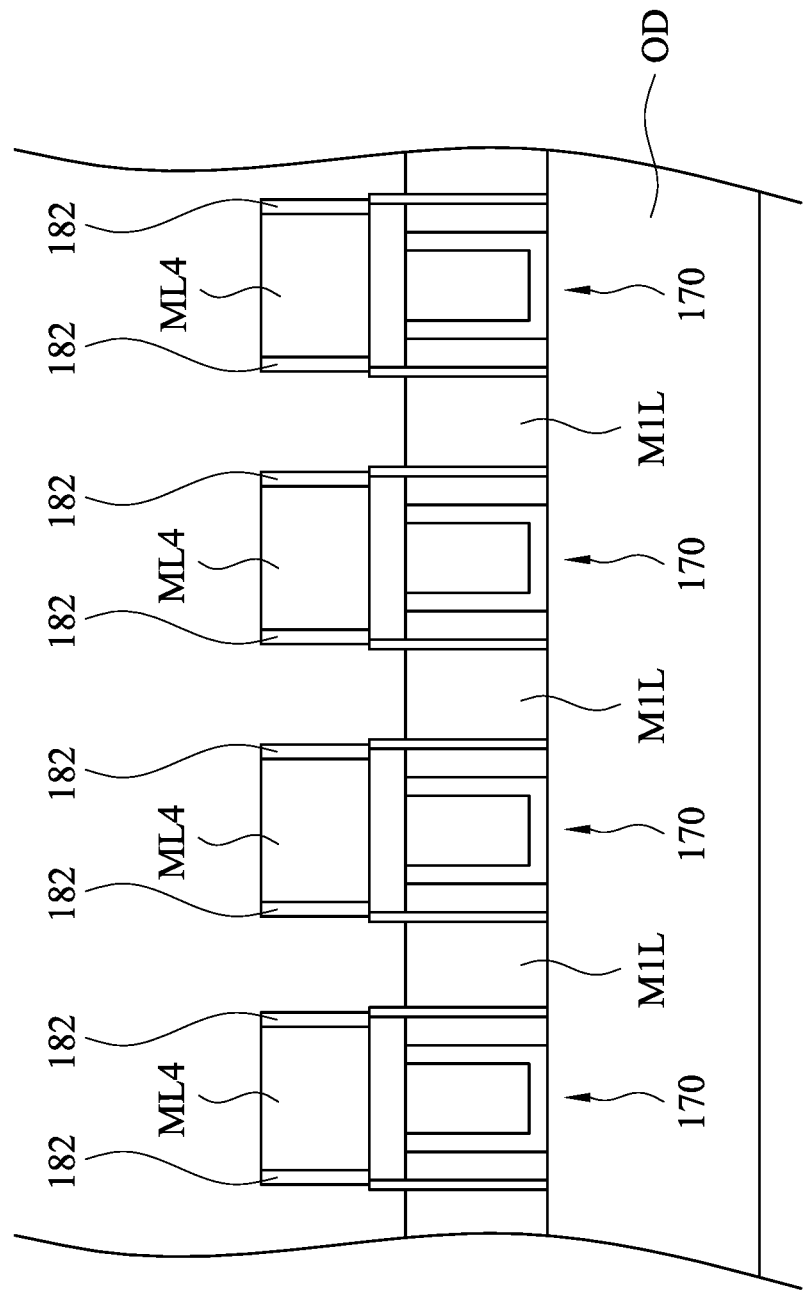
Figure 1S:
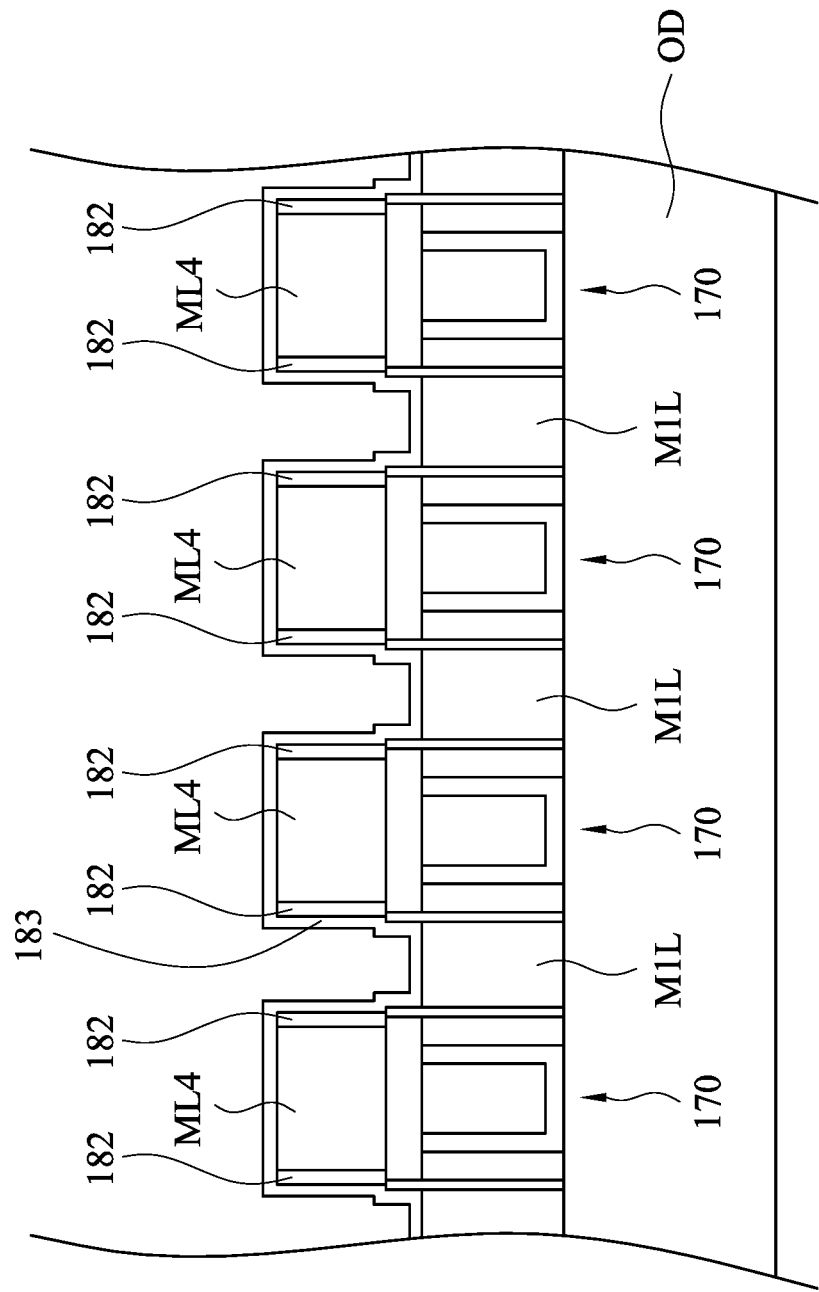
Figure 1T:
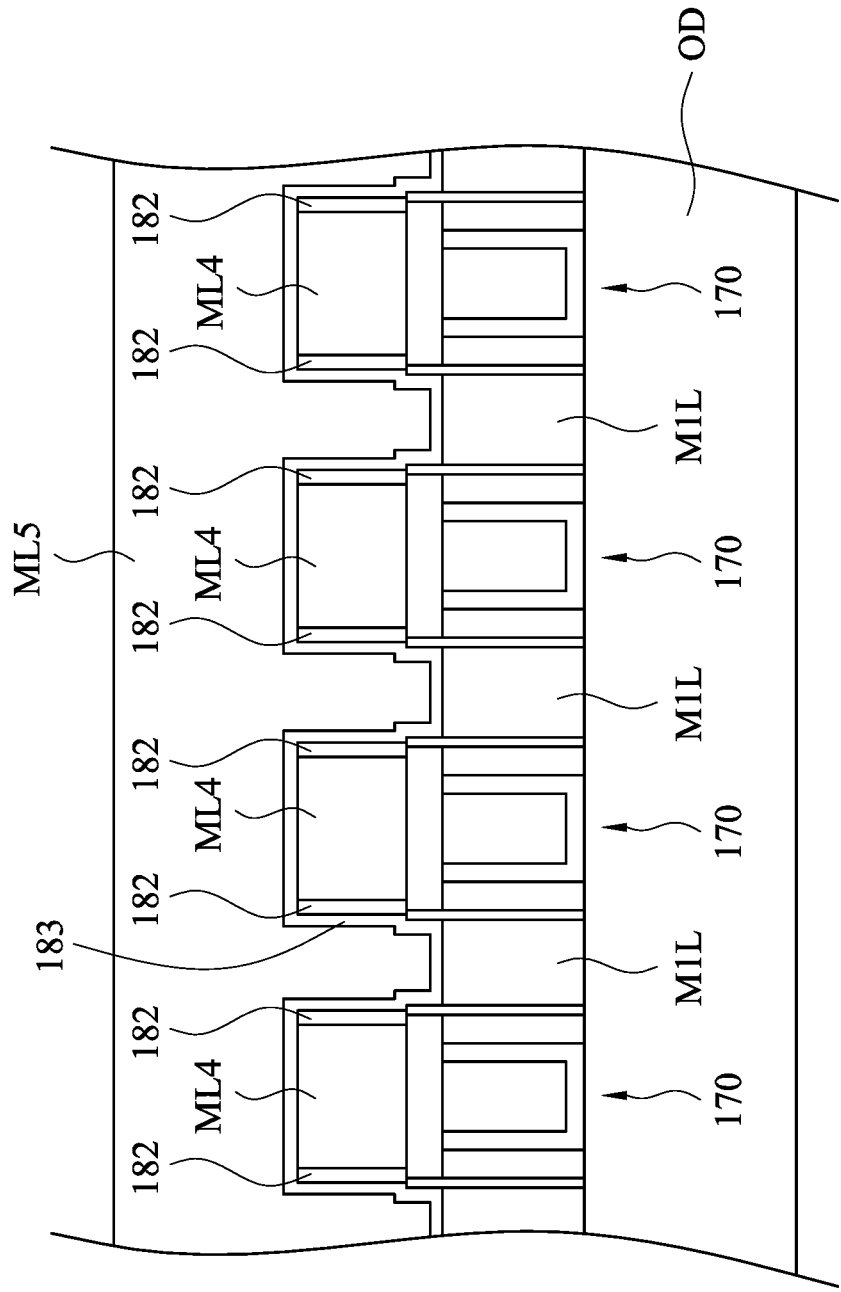
Figure 1U:
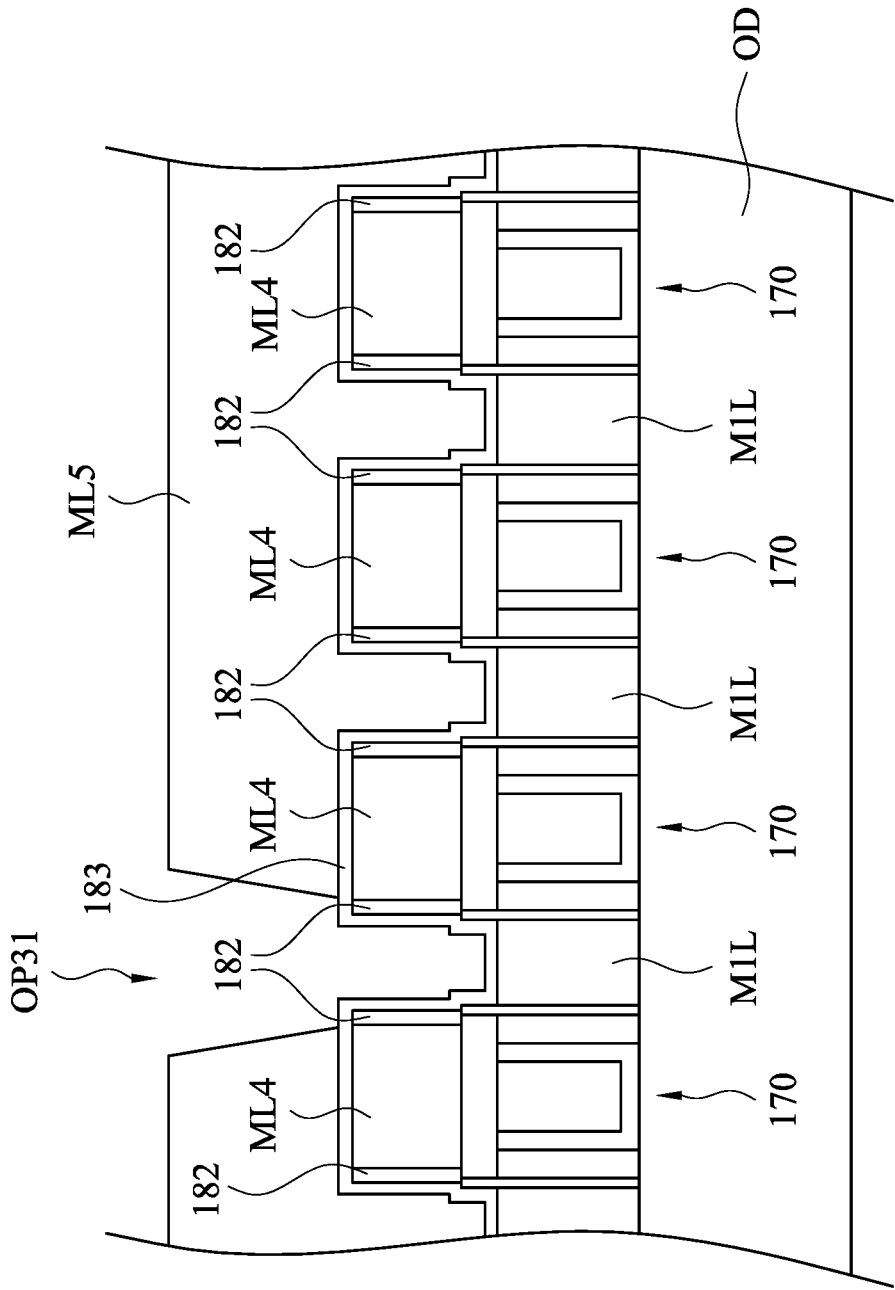
Figure 1V:
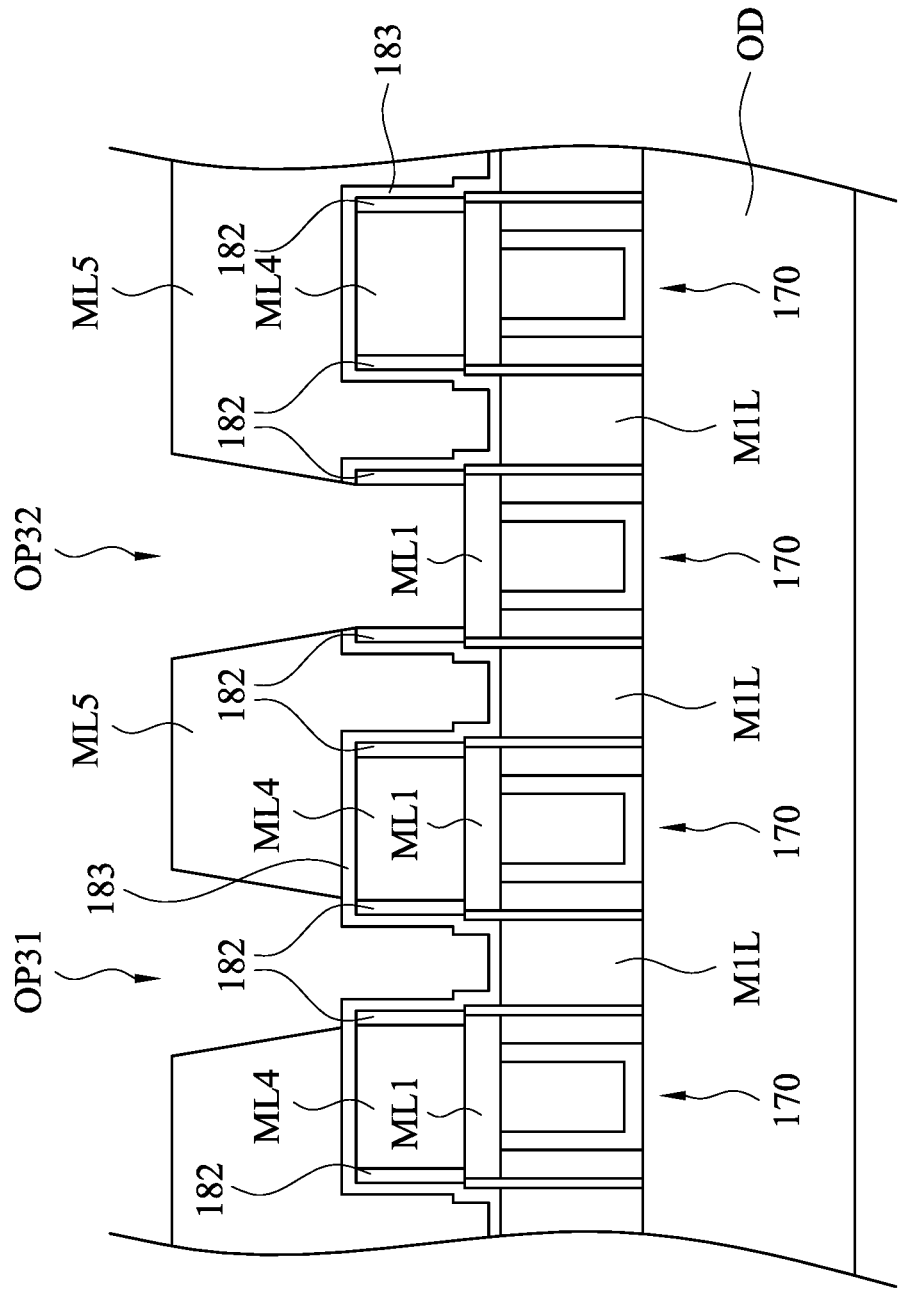
Figure 1W:
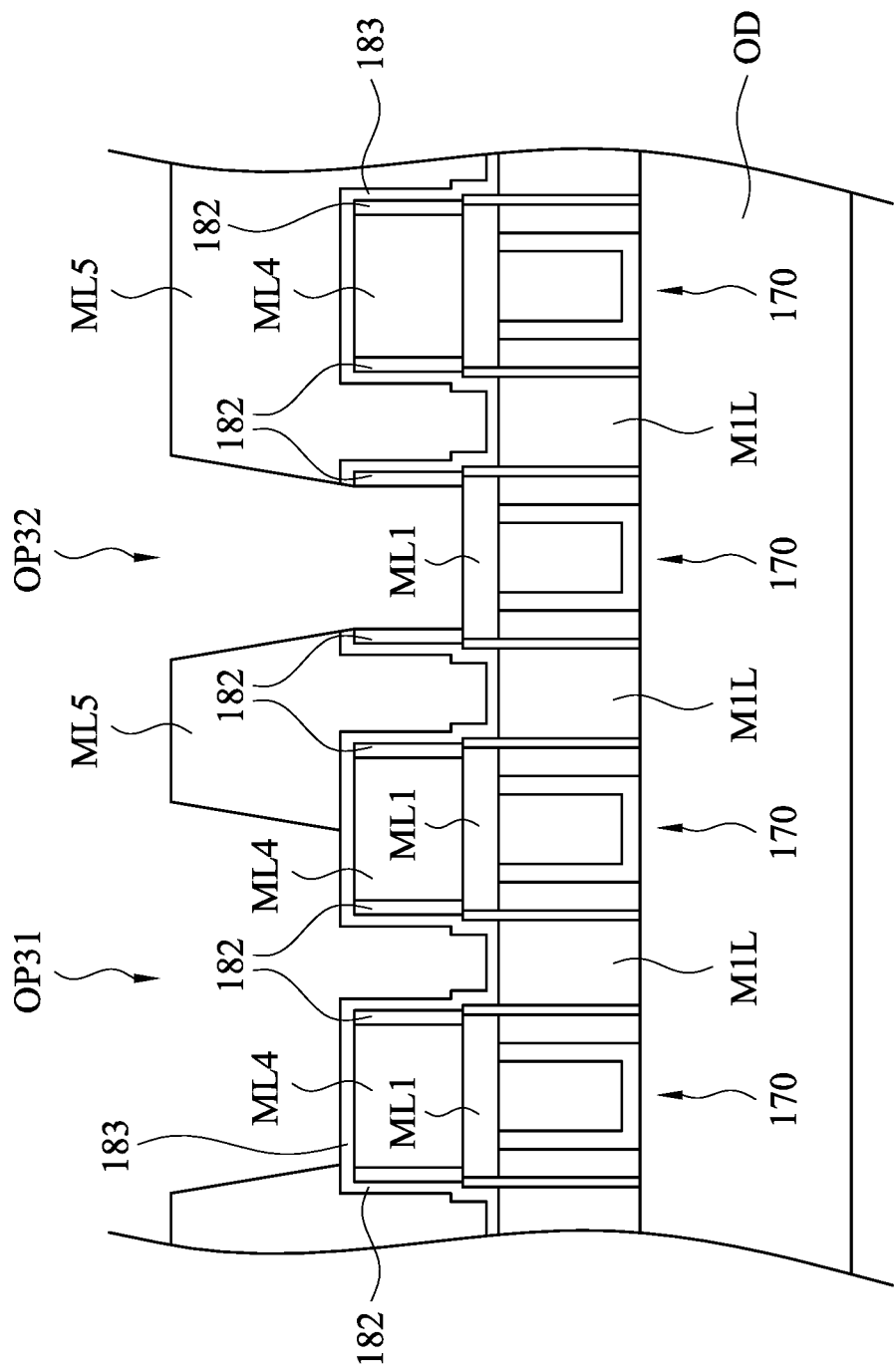
Figure 1X:
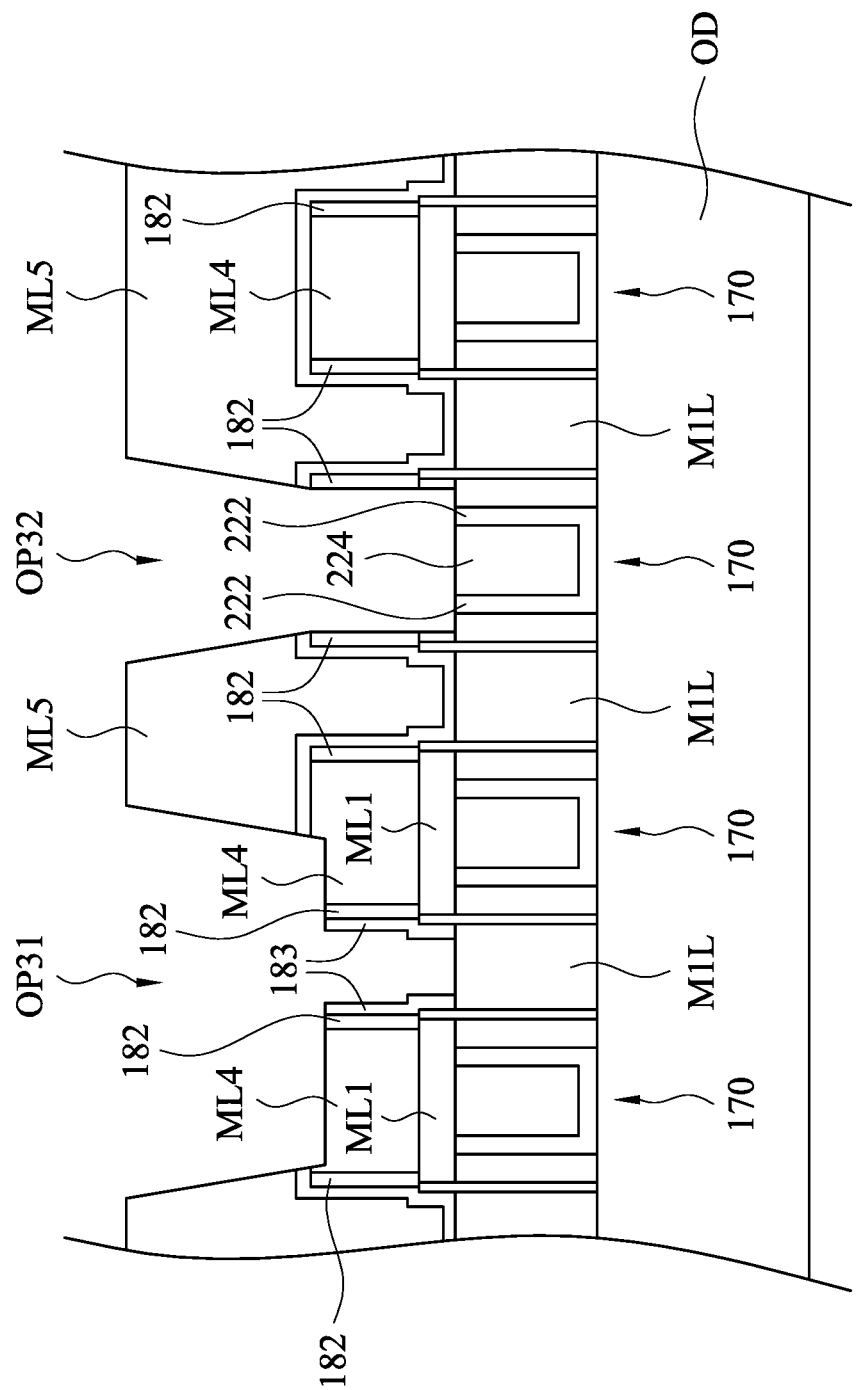
Figure 1Y:
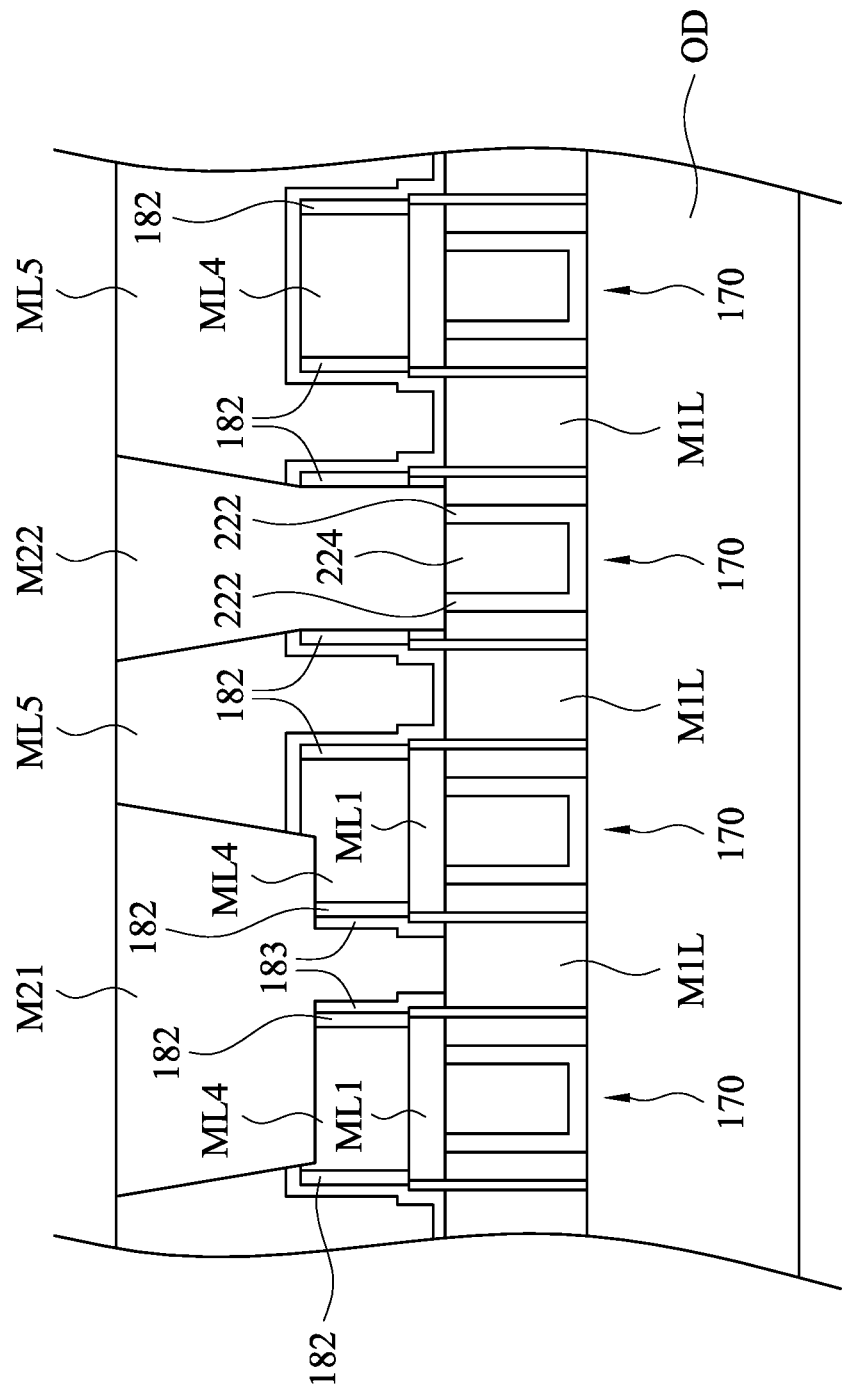

Referring to FIG. 1A to FIG. 1Y, FIG. 1A to FIG. 1Y are schematic cross-sectional views of intermediate stages showing a method for fabricating a transistor device having a self-alignment structure in accordance with some embodiments of the present disclosure. At first, a FinFET device 100 is provided as shown in FIG. 1A and FIG. 1B, in which FIG. 1B is a cross-sectional view of a portion of the FinFET device 100 along a cut line CL1-CL1' in FIG. 1A. The FinFET device 100 includes a semiconductor substrate 110, plural dummy gate structures 120, plural fin structures 130, source/drain structures 140 and a dielectric layer 150. The dummy gate structures 120, the fin structures 130, the source/drain structures 140 and a dielectric layer 150 are formed on the semiconductor substrate 110. In some embodiments, the semiconductor substrate 110 may be a semiconductor material and may include structures including a graded layer or a buried oxide, for example. In some exemplary examples, the semiconductor substrate 110 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 110. Alternatively, the silicon semiconductor substrate 110 may be an active layer of a semiconductor-on-insulator (SOI) substrate or a multi-layered structure such as a silicon-germanium layer formed on a bulk silicon layer.

The dielectric layer 150 is formed on the semiconductor substrate 110 and includes plural openings. The fin structures 130 are formed on the semiconductor substrate 110 and pass through the dielectric layer 150 through the openings in the dielectric layer 150, thus top potions of the fin structures 130 are exposed outside the dielectric layer 150. The source/drain structures 140 are formed on the top portions of the fin structures 130. In some embodiments, the source/drain structures 140 are epitaxial layers, but embodiments of the present disclosure are not limited thereto.

As shown in FIG. 1B, each of the dummy gate structures 120 includes a main portion 122 and a spacer layer 124. The main portion 122 is a stacked structure located under the spacer 124. For convenience of illustrations, an active deice region OD including the semiconductor substrate 110, the dielectric layer 150 and portions of the fin structures 130 is defined in FIG. 1B.

Thereafter, a mask layer 161 is formed to cover the dummy gate structures 120 and the active device region OD, as shown in FIG. 1C. In this embodiment, the mask layer 161 is a silicon layer, but embodiments of the present disclosure are not limited thereto. In some embodiments, the mask layer 161 is an oxide layer and can be formed by using a plasma enhanced chemical vapor deposition (PECVD) process, a chemical vapor deposition (CVD) process, an atomic layer deposition (ALD), or a physical vapor deposition process (PVD).

Then, top portions of each of the dummy gate structures 120 are etched, as shown in FIG. 1D. After the dummy gate structures 120 are etched, the spacer layers 124 are split to form spacers 125 located on sidewalls of the etched main portion 122, and each of the etched dummy gate structures 120 is higher than the etched mask layer 610 remained between the etched dummy gate structures 120. The process used to etch the dummy gate structures 120 can be a wet etching process or dry etching process. However, embodiments of the present disclosure are not limited thereto.

Thereafter, another mask layer 162 is formed to cover the etched dummy gate structures 120 and the remained mask layers 161 located between the etched dummy gate structures 120, as shown in FIG. 1E. In this embodiment, the mask layer 162 is an oxide layer, and can be formed by using a plasma enhanced chemical vapor deposition (PECVD) process, a chemical vapor deposition (CVD) process, an atomic layer deposition (ALD), or a physical vapor deposition process (PVD). However, embodiments of the present disclosure are not limited thereto.

Then, the mask layer 162 and the etched dummy gate structures 120 are polished, as shown in FIG. 1F. In this embodiment, chemical-mechanical polishing (CMP) is used to polish the mask layer 162 and the etched dummy gate structures 120, but embodiments are not limited thereto.

Thereafter, the main portions 122 remained between the spacers 125 are removed to form the openings OP between the spacers 125, as shown in FIG. 1G.

Then, the openings OP are filled with a dielectric material layer 163 and a conductive material layer 164, as shown in FIG. 1H. In this embodiment, the dielectric material layer 163 is high-k dielectric material, and the conductive material 164 is metal, but embodiments of the present disclosure are not limited thereto. In this embodiment, the dielectric material layer 163 and the conductive material layer 164 are formed by using a plasma enhanced chemical vapor deposition (PECVD) process, a chemical vapor deposition (CVD) process, an atomic layer deposition (ALD), or a physical vapor deposition process (PVD).

Thereafter, portions of the dielectric material 163 located outside the openings OP and portions of the conductive material 164 located outside the openings OP are removed, thereby forming gate structures 170, as shown in FIG. 1I. Each of the gate structures 170 includes the spacers 125, a portion of the dielectric layer 163 and a portion of the conductive layer 164. Since the dielectric material layer 163 is high-k dielectric material, and the conductive material 164 is metal, the gate structures 170 can be considered as high-k metal gate structures. In some embodiments, a polishing process is performed on the gate structures 170 to decrease a height of each of the gate structures 170. In this embodiment, each of the gate structures 170 have a height H in a range from 10 nm (nanometer) to 32 nm. The height H of the gate structures 170 benefits the fabrication of the self-alignment structure. If the gate structures 170 have a height greater than 32 nm, the fabrication of the self-alignment structure may be difficult. However, if the gate structures 170 have a height smaller than 10 nm, the performance of the gate structures 170 may be degraded. In this embodiment, the polishing process performed on the gate structures 170 can be chemical-mechanical polishing (CMP), but embodiments of the present disclosure are not limited thereto.

Then, mask layers ML1 (hereinafter referred to as first mask layers ML1) are formed on the gate structures 170, as shown in FIG. 1J. The first mask layers ML1 are used to protect the gate structures 170 from being damaged in subsequent operations, and thus the first mask layers ML1 are formed to fully cover top surfaces of the gate structures 170. In this embodiment, the first mask layers ML1 are formed by silicon nitride, but embodiments of the present disclosure are not limited thereto.

Thereafter, the mask layers 161 and 162 are removed, and a mask layer ML2 (hereinafter referred to as a second mask layer ML2) is formed on the first mask layers ML1 and the gate structures 170, as shown in FIG. 1K. Specifically, the second mask layer ML2 is formed to fully cover the gate structures 170. Further, protection layers 181 can be formed on sidewalls of the gate structures 170 to protect the gate structures 170 from being damaged in subsequent operations. For example, the mask layers 161 and 162 are removed by etching the mask layers 161 and 162 at first. Then, the protection layers 181 are formed on sidewalls of the gate structures 170. Thereafter, the second mask layer ML2 is formed to cover the gate structures 170. In this embodiment, the mask layer ML2 is a spin-on-carbon (SOC) layer, and the protection layers 181 are formed by silicon nitride. However, embodiments of the present disclosure are not limited thereto.

Then, openings OP1 (hereinafter referred to as first openings OP1) are formed in the second mask layer ML2, as shown in FIG. 1L. In this embodiment, the second mask layer ML2 is etched to form the openings OP1 including lower portions OP1L located between the gate structures 170. Further, potions ML2R of the second mask layer ML2 are remained on the gate structures 170 after the second mask layer ML2 is etched. Specifically, the remained portions ML2R of the second mask layer ML2 are located on the gate structures 170 in a one-to-one manner. In this embodiment, the second mask layer ML2 can be etched by using a wet etching process or dry etching process, but embodiments of the present disclosure are not limited thereto.

It is noted that the second mask layer ML2 can be etched with a greater value of critical dimensions uniformity (CDU) and overlay. For example, when the second mask layer ML2 is etched by an etching process to form the first openings OP1, the critical dimensions uniformity (CDU) and overlay of the etching process can be controlled to enable each of the first openings OP1 to have a sufficient width to cover a corresponding gap region G between adjacent gate structures 170.

Thereafter, the first openings OP1 are filled with mask layers ML3 (hereinafter referred to as third mask layers ML3), as shown in FIG. 1M. In this embodiment, the third mask layers ML3 is a silicon layer formed by an epitaxial growth process, but embodiments of the present disclosure are not limited thereto.

In some embodiments, a polishing process can be performed to polish the third mask layer ML3 and the remained portions ML2R of the second mask layer ML2. The polishing process can be chemical-mechanical polishing (CMP), but embodiments of the present disclosure are not limited thereto.

Then, the remained portions ML2R of the second mask layer ML2 are removed to expose the first mask layers ML1, and pacers 182 are formed on sidewalls of the mask layers ML3, as shown in FIG. 1N. The spacers 182 are formed to define regions for receiving contacts of the gate structures 170 and the source/drain structures 140. The spacers 182 are formed by silicon nitride, but embodiments of the present disclosure are not limited thereto.

Thereafter, mask layers ML4 (hereinafter referred to as fourth mask layers ML4) are formed on the exposed first mask layers ML1, as shown in FIG. 1O. In this embodiment, the fourth mask layers ML4 are located between the spacers 182, and contacts the spacers 182 and the first mask layers ML1. In some embodiments, the fourth mask layers ML4 are formed by oxide, for example a low temperature oxide such as silicon oxide. In some embodiments, the fourth mask layers ML4 are formed by using a plasma enhanced chemical vapor deposition (PECVD) process, a chemical vapor deposition (CVD) process, a flowable chemical vapor deposition (FCVD) process, or an atomic layer deposition (ALD).

Further, in some embodiments, a polishing process can be performed to polish the third mask layer ML3, the spacers 182 and the fourth mask layer ML4. The polishing process can be chemical-mechanical polishing (CMP), but embodiments of the present disclosure are not limited thereto.

Then, the third mask layers ML3 are removed to form second openings OP2, as shown in FIG. 1P. The openings OP2 includes lower portions OP2L located between the gate structures 170. In this embodiment, the mask layers ML3 are removed by using an etching process, such as a wet etching process or a dry etching process, but embodiments of the present disclosure are not limited thereto.

Thereafter, the second openings OP2 are filled with first conductive layers M1, as shown in FIG. 1Q. The first conductive layers M1 includes lower portions M1L located in the lower portions OP2L of the second openings OP2. In this embodiment, the first conductive layers M1 can be a metal layer such as an alloy having controlled additions of nickel, cobalt, silicon and either magnesium or phosphorous. However, embodiments are not limited thereto. In some embodiments, the first conductive layers M1 can be a doped silicon material layer. The first conductive layers M1 can be formed by using a plasma enhanced chemical vapor deposition (PECVD) process, a chemical vapor deposition (CVD) process, an atomic layer deposition (ALD), or a physical vapor deposition process (PVD).

In some embodiments, a polishing process can be performed to polish the first conductive layers M1, the spacers 182 and the fourth mask layer ML4. The polishing process can be chemical-mechanical polishing (CMP), but embodiments of the present disclosure are not limited thereto.

Then, the conductive layers M1 are etched, and a lining layer 183 is formed on the etched conductive layers M1, as shown in FIG. 1R and FIG. 1S. In FIG. 1R, the conductive layers M1 are etched, and the lower portions M1L of the conductive layers M1 are remained in the lower portions OP2L of the of the second openings OP2 after the conductive layers M1 are etched. An etching process used to etch the conductive layers M1 can be a wet etching process or a dry etching process, but embodiments of the present disclosure are not limited thereto. In FIG. 1S, the lining layer 183 is formed to cover the lower portions M1L of the conductive layers M1 and the fourth mask layers ML4, thereby protecting the conductive layers M1 and the fourth mask layers ML4 from being etched in subsequent operations. In this embodiment, the lining layer 183 is formed by silicon nitride, but embodiments of the present disclosure are not limited thereto.

Thereafter, a mask layer ML5 (hereinafter referred to as a fifth mask layer ML5) is formed on lower portions M1L of the first conductive layers M1 and the fourth mask layers ML4, as shown in FIG. 1T. In some embodiments, the fifth mask layer ML5 covers underlying structures such as the lining layer 183, the lower portions M1L of the first conductive layers M1 and the fourth mask layers ML4. In this embodiment, the mask layer ML5 is a carbon-rich dielectric layer, such a carbon-rich silicon carbide-like layer, but embodiments of the present disclosure are not limited thereto.

In some embodiments, the term "carbon-rich" used in conjunction with the dielectric layer denotes that the dielectric layer contains a carbon concentration greater than or equal to about 30 atomic %, or a carbon concentration in a range from about 35 to about 60 atomic %.

Then, openings OP31 and OP32 (hereinafter referred to as third openings OP31 and OP32) are formed in the fifth mask layer ML5 for receiving contacts of the source/drain structure 140 and the gate structures 170, as shown in FIG. 1U, FIG. 1V and FIG. 1W. In this embodiment, the fifth mask layer ML5 is etched to form the third openings OP31 and OP32 as shown in FIG. 1U and FIG. 1V at first, then the fifth mask layer ML5 is further etched to enlarge the third openings OP31 as shown in FIG. 1W. Regarding the third openings OP31, the third openings OP31 are formed to pass through the fifth mask layer ML5 and reach the lining layer 183. Regarding the third openings OP32, the third openings OP32 are formed to pass through the fifth mask layer ML5, the lining layer 183 and the mask layers ML4 and reach the mask layers M1.

Thereafter, etching processes are performed to remove portions of the lining layer 183 and portions of the mask layers M1, thereby exposing the lower portions M1L of the conductive layers M1 and the gate structures 170, as shown in FIG. 1X.

Then, conductive layers M21 and M22 (hereinafter referred to as second conductive layers M21 and M22) are formed in the third openings 31 and 32, as shown in FIG. 1Y. The second conductive layers M21 formed in the third openings OP31 can be considered as the contacts of the source/drain structures 140, and the second conductive layers M22 formed in the third openings OP32 can be considered as the contacts of the gate structures 170. In this embodiment, the second conductive layers M21 and M22 can be metal layers such as alloys having controlled additions of nickel, cobalt, silicon and either magnesium or phosphorous. However, embodiments are not limited thereto. In some embodiments, the second conductive layers M21 and M22 can be doped silicon material layers. The second conductive layers M21 and M22 can be formed by using a plasma enhanced chemical vapor deposition (PECVD) process, a chemical vapor deposition (CVD) process, an atomic layer deposition (ALD), or a physical vapor deposition process (PVD).

Figure 2A:
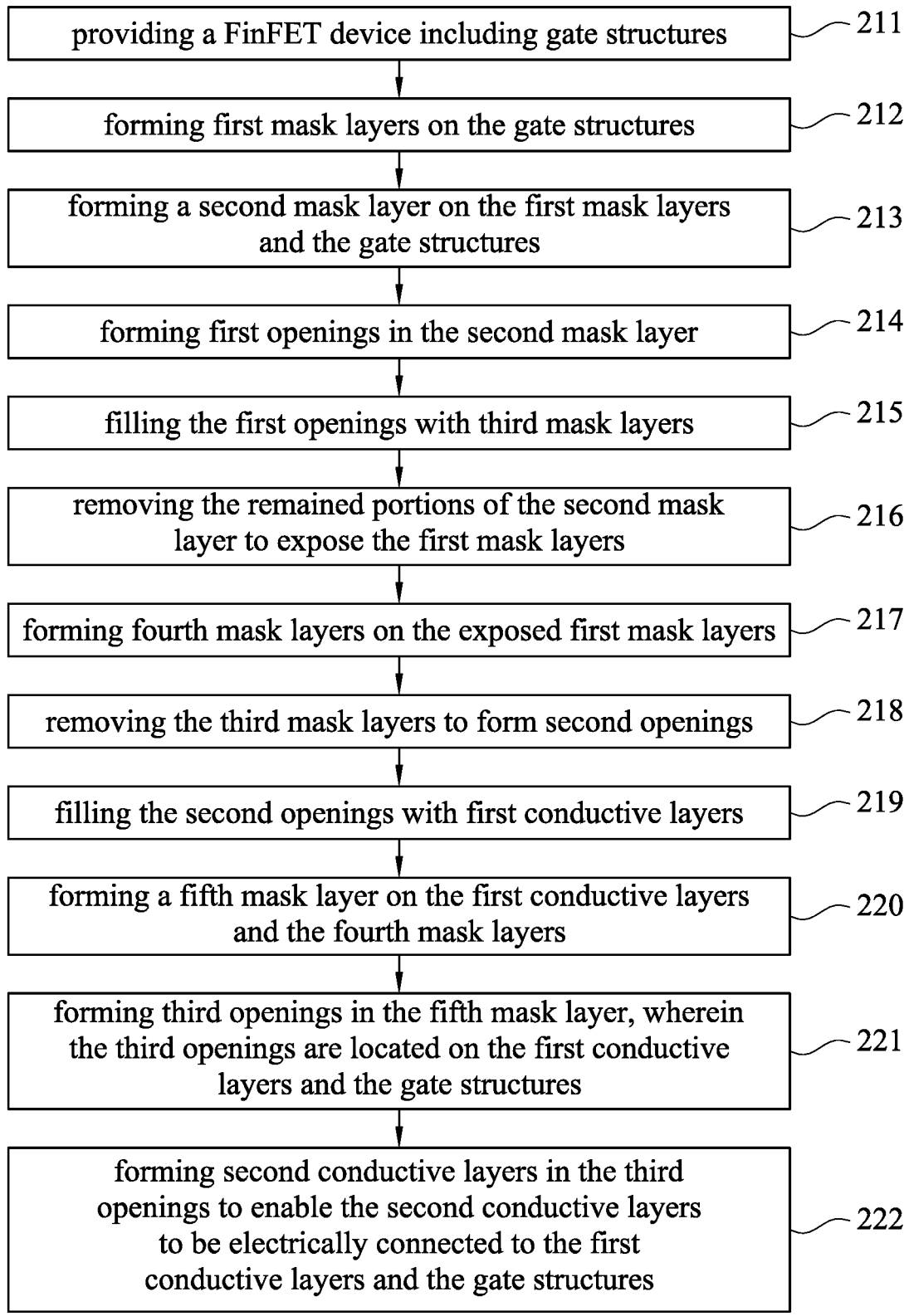
FIG. 2A is a flow chart showing a method for fabricating a semiconductor device in accordance with an embodiment of the present disclosure.

Referring to FIG. 2A with FIG. 1A to FIG. 1Y, FIG. 2A is a flow chart showing a method 200 for fabricating a semiconductor device in accordance with embodiments of the present disclosure. The method 200 begins at operation 211. Operation 211 is performed to provide the FinFET device including the active deice region OD and the gate structures 170, as shown in FIG. 1I.

Figure 2B:
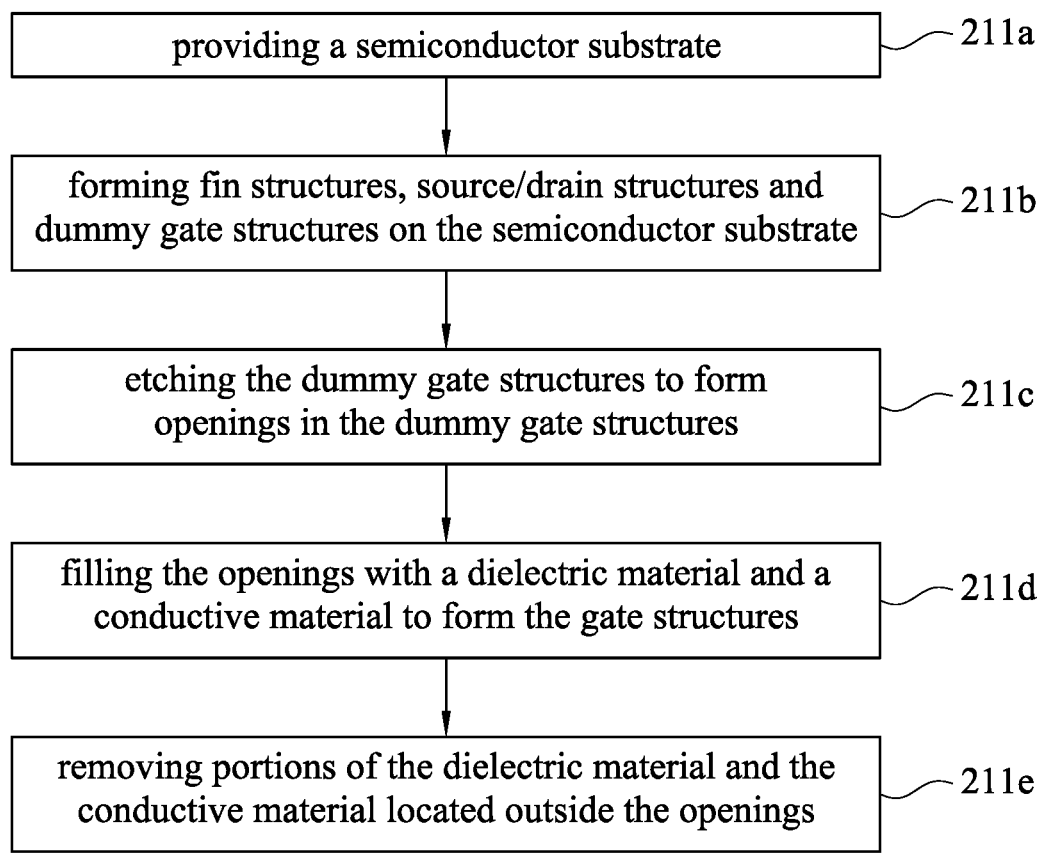
FIG. 2B is a flow chart showing a method for providing a FinFET device in accordance with an embodiment of the present disclosure.

Referring to FIG. 2B, FIG. 2B is flow chart showing a method 300 for providing the FinFET device as shown in FIG. 1I in accordance with an embodiment of the present disclosure. In the method 300, operations 211a and 221b are sequentially performed to provide the FinFET device 100, as shown in FIG. 1A. Operation 211a is performed to provide the semiconductor substrate 110, and operation 221b is performed to form the dummy gate structures 120, the fin structures 130, the source/drain structures 140, and the dielectric layer 150 on the semiconductor substrate 110, as shown in FIG. 1A and FIG. 1B. Each of the dummy gate structures 120 includes the main portion 122 and the spacer layers 124 covering the main portion 122.

Then, operation 211c is performed to etch the dummy gate structures 120, thereby forming openings OP in the dummy gate structures 120, as shown in FIG. 1G. In some embodiments, in operation 211c, at first, the mask layer 161 is formed to cover the dummy gate structures 120 and the active device region OD, as shown in FIG. 1C. In some embodiments, the mask layer 161 is an oxide layer and can be formed by using a plasma enhanced chemical vapor deposition (PECVD) process, a chemical vapor deposition (CVD) process, an atomic layer deposition (ALD), or a physical vapor deposition process (PVD). Then, a top portion of each of the dummy gate structures 120 is etched, as shown in FIG. 1D. After the dummy gate structures 120 are etched, the spacer layers 124 are split to form the spacers 125, and each of the etched dummy gate structures 120 is higher than the etched mask layer 161. The process used to etch the dummy gate structures 120 can be a wet etching process or dry etching process. However, embodiments of the present disclosure are not limited thereto. Thereafter, the mask layer 162 is formed to cover the etched dummy gate structures 120 and the remained mask layers 161 located between the etched dummy gate structures 120, as shown in FIG. 1E. In some embodiments, the mask layer 162 is an oxide layer, and can be formed by using a plasma enhanced chemical vapor deposition (PECVD) process, a chemical vapor deposition (CVD) process, an atomic layer deposition (ALD), or a physical vapor deposition process (PVD). However, embodiments of the present disclosure are not limited thereto. Then, the mask layer 162 and the etched dummy gate structures 120 are polished, as shown in FIG. 1F. In some embodiments, chemical-mechanical polishing (CMP) is used to polish the mask layer 162 and the etched dummy gate structures 120, but embodiments are not limited thereto. Thereafter, the main portions 122 remained between the spacers 125 are removed to form the openings OP between the spacers 125, as shown in FIG. 1G.

After operation 211c, operation 211d is performed to fill the openings OP with the dielectric material layer 163 and the conductive material layer 164, as shown in FIG. 1H. In some embodiments, the dielectric material layer 163 is high-k dielectric material, and the conductive material 164 is metal, but embodiments of the present disclosure are not limited thereto. In some embodiments, the dielectric material layer 163 and the conductive material layer 164 are formed by using a plasma enhanced chemical vapor deposition (PECVD) process, a chemical vapor deposition (CVD) process, an atomic layer deposition (ALD), or a physical vapor deposition process (PVD).

After operation 211d, operation 211e is performed to remove the portions of the dielectric material 163 located outside the openings OP and the portions of the conductive material 164 located outside the openings OP, thereby forming the gate structures 170, as shown in FIG. 1I. Each of the gate structures 170 includes the spacers 125, a portion of the dielectric layer 163 and a portion of the conductive layer 164. Since the dielectric material layer 163 is high-k dielectric material, and the conductive material 164 is metal, the gate structures 170 can be considered as high-k metal gate structures. In some embodiments, a polishing process is performed on the gate structures 170 to decrease a height of each of the gate structures 170. In this embodiment, each of the gate structures 170 have a height H substantially in a range from 10 nm (nanometer) to 32 nm. The height H of the gate structures 170 benefits the fabrication of the self-alignment structure. If the gate structures 170 have a height greater than 32 nm, the fabrication of the self-alignment structure may be difficult. However, if the gate structures 170 have a height smaller than 10 nm, the performance of the gate structures 170 may be degraded. In this embodiment, the polishing process performed on the gate structures 170 can be chemical-mechanical polishing (CMP), but embodiments of the present disclosure are not limited thereto.

Returning to FIG. 2A, operation 212 is performed after operation 211. In operation 212, the first mask layers ML1 are formed on the gate structures 170, as shown in FIG. 1J. The mask layers ML1 are used to protect the gate structures 170 from being damaged in subsequent operations, and thus the mask layers ML1 are formed to fully cover top surfaces of the gate structures 170. In this embodiment, the first mask layers ML1 are formed by silicon nitride, but embodiments of the present disclosure are not limited thereto.

Then, in operation 213, the mask layers 161 and 162 are removed, and the second mask layer ML2 is formed on the first mask layers ML1 and the gate structures 170, as shown in FIG. 1K. Specifically, the mask layer ML2 is formed to fully cover the gate structures 170. Further, the protection layers 181 can be formed on sidewalls of the gate structures 170 to protect the gate structures 170 from being damaged in subsequent operations. For example, the mask layers 161 and 162 are removed by etching the mask layers 161 and 162 at first. Then, the protection layers 181 are formed on sidewalls of the gate structures 170. Thereafter, the second mask layer ML2 is formed to cover the gate structures 170. In some embodiments, the mask layer ML2 is a spin-on-carbon (SOC) layer, and the protection layers 181 are formed by silicon nitride. However, embodiments of the present disclosure are not limited thereto.

In some embodiments, silicide layers (not shown) for the source/drain structure are formed on the source/drain structures 140 during operation 213.

Thereafter, in operation 214, the first openings OP1 are formed in the second mask layer ML2, as shown in FIG. 1L. In some embodiments, the second mask layer ML2 is etched to form the openings OP1 including lower portions OP1L located between the gate structures 170. Further, the potions ML2R of the second mask layer ML2 are remained on the gate structures 170 after the second mask layer ML2 is etched. Specifically, the remained portions ML2R of the second mask layer ML2 are located on the gate structures 170 in a one-to-one manner. In some embodiments, the second mask layer ML2 can be etched by using a wet etching process or dry etching process, but embodiments of the present disclosure are not limited thereto.

It is noted that the second mask layer ML2 can be etched with a greater value of critical dimensions uniformity (CDU) and overlay. For example, when the second mask layer ML2 is etched by an etching process to form the first openings OP1, the critical dimensions uniformity (CDU) and overlay of the etching process can be controlled to enable each of the first openings OP1 to have a sufficient width to cover a corresponding gap region G between adjacent gate structures 170.

Then, in operation 215, the first openings OP1 are filled with the third mask layer ML3, as shown in FIG. 1M. In this embodiment, the mask layers ML3 is a silicon layer formed by an epitaxial growth process, but embodiments of the present disclosure are not limited thereto. In some embodiments, a polishing process can be performed to polish the third mask layer ML3 and the remained portions ML2R of the second mask layer ML2. The polishing process can be chemical-mechanical polishing (CMP), but embodiments of the present disclosure are not limited thereto.

Thereafter, in operation 216, the remained portions ML2R of the second mask layer ML2 are removed to expose the first mask layers ML1, and pacers 182 are formed on sidewalls of the mask layers ML3, as shown in FIG. 1N. The spacers 182 are formed to define regions for receiving contacts of the gate structures 170 and the source/drain structures 140. The spacers 182 are formed by silicon nitride, but embodiments of the present disclosure are not limited thereto.

Then, in operation 217, the fourth mask layer ML4 are formed on the exposed first mask layers ML1, as shown in FIG. 1O. In some embodiments, the fourth mask layer ML4 are located between the spacers 182, and contacts the spacers 182 and the first mask layers ML1. In some embodiments, the mask layers ML4 are formed by oxide, for example a low temperature oxide such as silicon oxide. In some embodiments, the mask layers ML4 are formed by using a plasma enhanced chemical vapor deposition (PECVD) process, a chemical vapor deposition (CVD) process, a flowable chemical vapor deposition (FCVD) process, or an atomic layer deposition (ALD). Further, in some embodiments, a polishing process can be performed to polish the third mask layer ML3, the spacers 182 and the fourth mask layer ML4. The polishing process can be chemical-mechanical polishing (CMP), but embodiments of the present disclosure are not limited thereto.

Thereafter, in operation 218, the third mask layers ML3 are removed to form second openings OP2, as shown in FIG. 1P. The openings OP2 includes lower portions OP2L located between the gate structures 170. In some embodiments, the mask layers ML3 are removed by using an etching process, such as a wet etching process or a dry etching process, but embodiments of the present disclosure are not limited thereto.

Then, in operation 219, the second openings OP2 are filled with the first conductive layers M1, as shown in FIG. 1Q. The first conductive layers M1 includes lower portions M1L located in the lower portions OP2L of the second openings OP2. In some embodiments, the first conductive layers M1 can be a metal layer such as an alloy having controlled additions of nickel, cobalt, silicon and either magnesium or phosphorous. However, embodiments are not limited thereto. In some embodiments, the first conductive layers M1 can be a doped silicon material layer. The first conductive layers M1 can be formed by using a plasma enhanced chemical vapor deposition (PECVD) process, a chemical vapor deposition (CVD) process, an atomic layer deposition (ALD), or a physical vapor deposition process (PVD). In some embodiments, a polishing process can be performed to polish the first conductive layers M1, the spacers 182 and the fourth mask layer ML4. The polishing process can be chemical-mechanical polishing (CMP), but embodiments of the present disclosure are not limited thereto.

In addition, in some embodiments, the conductive layers M1 are etched, and the lining layer 183 is formed on the etched conductive layers M1, as shown in FIG. 1R and FIG. 1S. In FIG. 1R, the conductive layers M1 are etched, and the lower portions M1L of the conductive layers M1 are remained in the lower portions OP2L of the of the second openings OP2 after the conductive layers M1 are etched. An etching process used to etch the conductive layers M1 can be a wet etching process or a dry etching process, but embodiments of the present disclosure are not limited thereto. In FIG. 1S, the lining layer 183 is formed to cover the lower portions M1L of the conductive layers M1 and the fourth mask layers ML4, thereby protecting the conductive layers M1 and the fourth mask layers ML4 from being etched in subsequent operations. In some embodiments, the lining layer 183 is formed by silicon nitride, but embodiments of the present disclosure are not limited thereto.

Thereafter, in operation 220, the fifth mask layer ML5 is formed on the lower portions M1L of the first conductive layers M1 and the fourth mask layers ML4, as shown in FIG. 1T. In some embodiments, the fifth mask layer ML5 covers underlying structures such as the lining layer 183, the lower portions M1L of the first conductive layers M1 and the fourth mask layers ML4. In some embodiments, the mask layer ML5 is a carbon-rich dielectric layer, such a carbon-rich silicon carbide-like layer, but embodiments of the present disclosure are not limited thereto.

Then, in operation 221, the third openings OP31 and OP32 are formed in the fifth mask layer ML5 for receiving contacts of the source/drain structure 140 and the gate structures 170, as shown in FIG. 1U, FIG. 1V, FIG. 1W and FIG. 1X.

In some embodiments, the fifth mask layer ML5 is etched to form the third openings OP31 and OP32 as shown in FIG. 1U and FIG. 1V at first, then the fifth mask layer ML5 is further etched to enlarge the third openings OP31 as shown in FIG. 1W. Regarding the third openings OP31, the third openings OP31 are formed to pass through the fifth mask layer ML5 and reach the lining layer 183. Regarding the third openings OP32, the third openings OP32 are formed to pass through the fifth mask layer ML5, the lining layer 183 and the mask layers ML4 and reach the mask layers M1. Thereafter, etching processes are performed to remove portions of the lining layer 183 and portions of the mask layers M1, thereby exposing the lower portions M1L of the conductive layers M1 and the gate structures 170, as shown in FIG. 1X.

Then, in operation 222, the second conductive layers M21 and M22 are formed in the third openings 31 and 32, as shown in FIG. 1Y. The second conductive layers M21 formed in the third openings OP31 can be considered as the contacts of the source/drain structures 140, and the second conductive layers M22 formed in the third openings OP32 can be considered as the contacts of the gate structures 170. In some embodiments, the second conductive layers M21 and M22 can be metal layers such as alloys having controlled additions of nickel, cobalt, silicon and either magnesium or phosphorous. However, embodiments are not limited thereto. In some embodiments, the second conductive layers M21 and M22 can be doped silicon material layers. The second conductive layers M21 and M22 can be formed by using a plasma enhanced chemical vapor deposition (PECVD) process, a chemical vapor deposition (CVD) process, an atomic layer deposition (ALD), or a physical vapor deposition process (PVD).

It can be understood that embodiments of the present disclosure provides bottom-up self-aligned structure to help fabrication of a transistor device. In some embodiments, the bottom-up self-aligned structure includes plural spacer sets configured to define the regions for receiving the contacts of the source/drain structure 140 and the gate structures 170. For example, as shown in FIG. 1Y, each of the spacer sets includes two spacers 182 located on one gate structure 170, thereby defining a region for receiving a contact of the gate structure 170. For another example, as shown in FIG. 1Y, every two adjacent spacer sets define a region on the lower portion M1L of the first conductive layers M1 for receiving a contact of the source/drain structure 140. In some embodiments, as shown in FIG. 1Y, the bottom-up self-aligned structure includes the spacer sets including the spacers 182 and the lining layer 183 benefiting self-alignment of the contacts of the source/drain structure 140. Further, the gate structures 170 are provided with a decreased height, and the bottom-up self-aligned structure are formed on the gate structures 170, thereby benefiting the fabrication of the transistor device.

In addition, in operation 214, the second mask layer ML2 can be etched with a greater value of critical dimensions uniformity (CDU) and overlay. Returning to FIG. 1L, when the second mask layer ML2 is etched by an etching process to form the first openings OP1, the critical dimensions uniformity (CDU) and overlay of the etching process can be controlled to enable each of the first openings OP1 to have a sufficient width to cover a corresponding gap region G between adjacent gate structures, thereby benefiting the bottom-up self-aligned structure formation.

In accordance with an embodiment of the present disclosure, the present disclosure discloses a semiconductor device. The semiconductor device includes a semiconductor substrate, a first source/drain structure, a gate structure, a mask layer, a first lower conductor, an upper conductor and a lining layer. The first source/drain structure is located over the semiconductor substrate. The gate structure is located over the semiconductor substrate and adjacent to the first source/drain structure. The mask layer is located over the gate structure. The first lower conductor is located over the first source/drain structure. The upper conductor is located over the first lower conductor. The lining layer has a first portion over a top surface of the mask layer and a second portion over a sidewall of the mask layer, in which the second portion of the lining layer has a bottom surface over the first lower conductor.

In some embodiments, the second portion of the lining layer is between the upper conductor and the mask layer.

In some embodiments, the semiconductor device further includes a second source/drain structure over the semiconductor substrate and a second lower conductor over the second source/drain structure. The gate structure is located between the first lower conductor and the second lower conductor.

In some embodiments, the lining layer has a third portion in contact with the second lower conductor.

In some embodiments, the third portion of the lining layer is lower than the first portion of the lining layer.

In some embodiments, the bottom surface of the second portion of the lining layer is lower than a bottom surface of the mask layer.

In some embodiments, the upper conductor is in contact with the lining layer.

In some embodiments, the upper conductor has an upper portion over a top surface of the mask layer and a lower portion lower than the top surface of the mask layer, and the upper portion is wider than the lower portion.

In some embodiments, the second portion of the lining layer is between the upper portion and the first lower conductor.

In some embodiments, the semiconductor device further includes a spacer between the second portion of the lining layer and the sidewall of the mask layer.

In some embodiments, the upper conductor is in contact with a top surface of the spacer.

In some embodiments, the upper conductor is in contact with a top surface of the mask layer.

In accordance with another embodiment of the present disclosure, the present disclosure discloses a semiconductor device includes a semiconductor substrate, a first source/drain structure, a gate structure, a first lower conductor, an upper conductor and a lining layer. The first source/drain structure is located over the semiconductor substrate. The gate structure is located over the semiconductor substrate and adjacent to the first source/drain structure. The first lower conductor is located over the first source/drain structure. The upper conductor is located over the gate structure, and the upper conductor has an upper portion and a lower portion. The lining layer has a first portion over a sidewall of the lower portion and a second portion in contact with a top surface of the first lower conductor.

In some embodiments, the semiconductor device includes a second source/drain structure over the semiconductor substrate and a second lower conductor over the second source/drain structure. The gate structure is located between the first lower conductor and the second lower conductor.

In some embodiments, the lining layer has a third portion in contact with the second lower conductor.

In some embodiments, the semiconductor device further includes a spacer between the first portion of the lining layer and the sidewall of the lower portion.

In accordance with another embodiment of the present disclosure, the present disclosure discloses a semiconductor device. The semiconductor device includes a semiconductor substrate, a source/drain structure, a gate structure, a mask layer, a conductor and a lining layer. The source/drain structure is located over the semiconductor substrate. The gate structure is located over the semiconductor substrate and adjacent to the source/drain structure. The mask layer is located over the gate structure. The conductor is located over the source/drain structure. The lining layer is conformally located over a sidewall of the mask layer and a top surface of the conductor.

In some embodiments, the semiconductor device further includes a dielectric layer over the lining layer, in which the lining layer has a portion interposed between the top surface of the conductor and the dielectric layer.

In some embodiments, the semiconductor device further includes a spacer between the lining layer and the sidewall of the mask layer.

In some embodiments, the lining layer is in contact with a top surface of the spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a semiconductor substrate;
a first source/drain structure over the semiconductor substrate;
a gate structure over the semiconductor substrate and adjacent to the first source/drain structure;
a first mask layer directly above the gate structure;
a second mask layer directly above the first mask layer;
a mask spacer extending along a sidewall of the second mask layer to a top surface of the first mask layer;
a first source/drain contact over the first source/drain structure;
a via conductor over the first source/drain contact; and
a lining layer having a first portion over a top surface of the second mask layer and a second portion extending along the mask spacer to a top surface of the first source/drain contact.

2. The semiconductor device of claim 1, wherein the via conductor is further over the second portion of the lining layer.

3. The semiconductor device of claim 1, further comprising:
a second source/drain structure over the semiconductor substrate; and
a second source/drain contact over the second source/drain structure, wherein the gate structure is between the first source/drain contact and the second source/drain contact.

4. The semiconductor device of claim 3, wherein the lining layer has a third portion in contact with the second source/drain contact.

5. The semiconductor device of claim 4, wherein the third portion of the lining layer is lower than the first portion of the lining layer.

6. The semiconductor device of claim 1, wherein a bottom surface of the second portion of the lining layer is lower than a bottom surface of the second mask layer.

7. The semiconductor device of claim 1, wherein the via conductor is in contact with the lining layer.

8. The semiconductor device of claim 1, wherein the via conductor has an upper portion over a top surface of the second mask layer and a lower portion lower than the top surface of the second mask layer, and the upper portion is wider than the lower portion.

9. The semiconductor device of claim 8, wherein the second portion of the lining layer is between the upper portion of the via conductor and the first source/drain contact.

10. The semiconductor device of claim 1, wherein the via conductor is in contact with a top surface of the mask spacer.

11. The semiconductor device of claim 1, wherein the via conductor is in contact with a top surface of the second mask layer.

12. The semiconductor device of claim 1, wherein the second mask layer has sidewalls that are laterally set back from sidewalls of the first mask layer.

13. A semiconductor device, comprising:
a semiconductor substrate;
a first source/drain structure over the semiconductor substrate;
a gate structure over the semiconductor substrate and adjacent to the first source/drain structure;
a first source/drain contact over the first source/drain structure;
a via conductor over the gate structure, the via conductor having an upper portion and a lower portion lower than the upper portion;
a lining layer laterally surrounding the lower portion of the via conductor and in contact with a top surface of the first source/drain contact and
a spacer between the lining layer and the lower portion of the via conductor.

14. The semiconductor device of claim 13, further comprising:
a second source/drain structure over the semiconductor substrate; and
a second source/drain contact over the second source/drain structure, wherein the gate structure is between the first source/drain contact and the second source/drain contact.

15. The semiconductor device of claim 14, wherein the lining layer is further in contact with the second source/drain contact.

16. The semiconductor device of claim 13, wherein the lining layer has a stepped sidewall structure extending from the top surface of the first source/drain contact to the via conductor, and the stepped sidewall structure has a first sidewall, a second sidewall and an intermediary surface connecting the first sidewall to the second sidewall.

17. A semiconductor device, comprising:
a semiconductor substrate;
a source/drain structure over the semiconductor substrate;
a gate structure over the semiconductor substrate and adjacent to the source/drain structure;
a first mask layer in contact with a top surface of the gate structure;
a second mask layer in contact with a top surface of the first mask layer;
a mask spacer extending along a sidewall of the second mask layer;
a protection layer extending along a sidewall of the first mask layer and a sidewall of the gate structure;
a source/drain contact over the source/drain structure; and
a lining layer extending along a sidewall of the mask spacer and a sidewall of the protection layer to a top surface of the source/drain contact, wherein the sidewall of the protection layer is misaligned with the sidewall of the mask spacer.

18. The semiconductor device of claim 17, further comprising:
a dielectric layer over the lining layer, wherein the lining layer has a portion interposed between the top surface of the source/drain contact and the dielectric layer.

19. The semiconductor device of claim 17, wherein the lining layer is in contact with a top surface of the mask spacer.

20. The semiconductor device of claim 17, wherein the first mask layer is wider than the second mask layer.

* * * * *